United States Patent [19]
Matsugatani et al.

[11] Patent Number: 6,066,997
[45] Date of Patent: May 23, 2000

[54] FREQUENCY MULTIPLIER WITH FUNDAMENTAL WAVE REFLECTION

[75] Inventors: Kazuoki Matsugatani; Manabu Sawada, both of Kariya; Kunihiko Sasaki, Kuwana, all of Japan

[73] Assignee: Denso Corporation, Kariya, Japan

[21] Appl. No.: 08/928,395

[22] Filed: Sep. 12, 1997

[30] Foreign Application Priority Data

Sep. 13, 1996 [JP] Japan .................................. 8-242973
Sep. 17, 1996 [JP] Japan .................................. 8-244605

[51] Int. Cl.⁷ .............................. H03H 11/04; H01P 1/20
[52] U.S. Cl. ........................ 333/218; 327/119; 327/122; 327/123
[58] Field of Search ............................ 333/218; 363/157, 363/159, 163; 327/119, 122, 123

[56] References Cited

U.S. PATENT DOCUMENTS

| | | | |
|---|---|---|---|
| 5,392,014 | 2/1995 | Nishida et al. | 333/218 |
| 5,406,237 | 4/1995 | Ravas et al. | 333/218 |
| 5,886,595 | 3/1999 | Von Stein | 333/218 |

FOREIGN PATENT DOCUMENTS

| | | | |
|---|---|---|---|
| 247608 | 10/1987 | Japan | 333/218 |
| 4242304 | 8/1992 | Japan | 363/157 |

OTHER PUBLICATIONS

Ogawa et al., "A 50 Ghz GaAs FET MIC Transmitter/Receiver Using Hermetic Miniature Probe Transitions" IEEE Transactions on Microwave Theory and Techniques, v.37, No. 9, Sep. 1989, pp. 1434–1441.

Khanna et al., "A 45 Ghz Highly Stable +15dBm Low Noise GaAs MESFET Source Using A GaAs PHEMT as a Frequency Doubler", Microwave Journal, v. 34, No. 11, Nov. 1991, pp. 117–118, 121, 125–127.

Yoshitada et al., "Second–Harmonic Reflector Type High–Gain FET Frequency Doubler Operating in K–Band", Int'l Microwave Symp. Digest Long Beach, Jun. 13–15, 1989, Vols 1–3 Bound as One, vol. 1, Jun. 13, 1989, Inst. of Electrical and Electronics Engineers, pp. 1291–1294.

Borg et al., "Novel MIC Bipolar Frequency Doublers Having High Gain, Wide Bandwidth and Good Spectral Performance", IEEE Transactions on Microwave Theory and Techniques, vol. 39, No. 12, Dec. 1, 1991, pp. 1936–1946.

Patent Abstracts of Japan: JP 58–177011, Oct. 17, 1983, Iwakuni Mikio, "Oscillation Multiplier"—see abstract.

*Primary Examiner*—Benny Lee
*Attorney, Agent, or Firm*—Pillsbury Madison & Sutro LLP

[57] ABSTRACT

A frequency multiplier is constructed to input an input signal to a transistor through an input matching circuit and to output a multiplied output signal from the transistor through a reflecting type fundamental wave signal band suppressing circuit and an output matching circuit. A transmission line produces a standing wave and is disposed between the output terminal of the transistor and the input terminal of the reflecting type fundamental wave signal band suppressing circuit. Because the voltage acting on the output terminal of the transistor consequently increases, the transistor operates at a point at which the nonlinearity of its input-output characteristic is greater and the output power of the multiplied output signal increases.

7 Claims, 13 Drawing Sheets

FREQUENCY MULTIPLIER WITH FUNDAMENTAL WAVE REFLECTION

CROSS REFERENCE TO RELATED APPLICATION

This application is based upon and claims the benefit of priority of prior Japanese Patent Applications No. H. 8-242973 filed on Sep. 13, 1996 and No. H. 8-244605 filed on Sep. 17, 1996, the contents of which are incorporated herein by reference.

BACKGROUND OF THE INVENTION

1. Field of the Invention

This invention relates to a frequency multiplier constructed to input a microwave or millimeter wave frequency band signal and output a multiplied output signal whose frequency is a multiple of that of the input signal, and to a voltage controlled oscillator necessary for the utilization of waves of these frequency bands.

2. Prior Arts

A frequency multiplier is constructed to output a signal (namely, a multiplied output signal) whose frequency is a multiple of that of an input signal by utilizing the nonlinearity of the input-output characteristic of a transistor or the like. In this construction, it is required that the power of the multiplied output signal be made large and that the power of unwanted output signals be made small. Here, unwanted output signals are low-order or high-order frequency signals that are signals other than the multiplied output signal in the output signal outputted from the transistor or other device. Among these unwanted output signals, the output signal having the same frequency as the frequency of the input signal is called the fundamental wave signal. The output power of this fundamental wave signal is often greater than the output power of the multiplied output signal, and for this reason a circuit is provided in the frequency multiplier for suppressing this fundamental wave signal so that it is not outputted.

This kind of frequency multiplier is basically made up of an input matching circuit, a transistor, a fundamental wave signal band suppressing circuit, and an output matching circuit. The input matching circuit is a circuit for providing matching with respect to the frequency of the input signal, and the output matching circuit is a circuit for providing matching with respect to the frequency of the multiplied output signal. For the fundamental wave signal band suppressing circuit, a reflecting type circuit is generally used which reflects the fundamental wave signal (unwanted signal).

There have been frequency multipliers of the 20 construction described above consisting of monolithic microwave integrated circuits (MMIC). An example of such a construction is the frequency multiplier shown in 'A 60 GHz MMIC STABILIZED FREQUENCY SOURCE COMPOSED OF A 30 GHz DRO AND A DOUBLER', 1995 IEEE Microwave Symp. Digest pp. 71–74. The construction of this frequency multiplier is shown in FIG. 7.

As shown in FIG. 7, a frequency multiplier 1 has an input matching circuit 2, a transistor 3, a reflecting type fundamental wave signal band suppressing circuit 4 and an output matching circuit 5. The input matching circuit 2 consists of a transmission line 6 and a stub 7. One end of a capacitor 8 is connected to a point of connection between the transmission line 6 and the stub 7, and the other end of this capacitor 8 is made an input terminal 9. The transistor 3 consists of, for example, an FET; its gate is connected to an end of the transmission line 6 of the input matching circuit 2 and is also grounded by way of a transmission line 10 and a capacitor 11.

The reflecting type fundamental wave signal band suppressing circuit 4 consists of an open stub 12. The output matching circuit 5 is made up of a transmission line 13 and a stub 14. The drain of the transistor 3 is connected to one end of the open stub 12 and to one end of the transmission line 13 and also is grounded by way of a transmission line 15 and a capacitor 16. A point of connection between the transmission line 13 and the stub 14 is connected to one end of a capacitor 17, and the other end of this capacitor 17 is made an output terminal 18. A point of connection between the transmission line 10 and the capacitor 11 is made a voltage terminal 19 through which a gate bias is supplied. A point of connection between the transmission line 15 and the capacitor 16 is made a voltage terminal 20 through which a drain bias is supplied.

In a frequency multiplier of the construction described above, because the multiplied output signal is generated utilizing the nonlinearity of the input-output characteristic of the transistor 3, the conversion gain of the frequency multiplier is generally very low; in other words, there is the characteristic that the output power of the multiplied output signal is low. Because of this, there has been a strong need for the conversion gain of frequency multipliers to be increased.

In this connection, the present inventors tried various experiments with the aim of increasing the conversion gain of a frequency multiplier. First, the inventors focused on the known characteristic that when the transistor is operated at a point at which the nonlinearity of the input-output characteristic of the transistor is greater the output power of the multiplied output signal increases. At that time, the inventors noticed that the transistor can be made to operate at a point at which the nonlinearity of the input-output characteristic of the transistor is greater by raising the high-frequency voltage acting on the output terminal of the transistor.

Here, as a method of raising the high-frequency voltage acting on the output terminal of the transistor, the method of connecting a voltage terminal for impressing a bias voltage from outside to the output terminal of the transistor is readily conceivable. However, when a voltage is impressed in this way, all that happens is that the direct current voltage level rises, and the effect of the high-frequency voltage rising intended by the inventors cannot be expected.

In view of this, the inventors looked for a method of raising the high-frequency voltage acting on the output terminal of the transistor without impressing a voltage from outside. The inventors focused on the fact that the fundamental wave signal outputted through the output terminal of the transistor is reflected by the reflecting type fundamental wave signal band suppressing circuit and then this reflected signal is reflected at the output terminal of the transistor, by such reflections of the signal being repeated, the (reflection) decay of the signal occurs in the part (the transmission line) connecting the output terminal of the transistor to the input terminal of the reflecting type fundamental wave signal band suppressing circuit. The inventors had the idea that it might be possible to raise the voltage acting on the output terminal of the transistor by utilizing this reflection, and as a result of pursuing this idea invented a construction wherein a transmission line having the function of producing a standing wave on the basis of the above-mentioned fundamental wave signal and its reflected signal is provided between the output terminal of the transistor and the input terminal of the reflecting type fundamental wave signal band suppressing circuit.

To confirm the operation of this construction, the inventors carried out the experiment of making an MMIC type of frequency multiplier wherein a transmission line having the function of producing a standing wave is provided between the output terminal of a transistor and the input terminal of a reflecting type fundamental wave signal band suppressing circuit. When the output power of the multiplied output signal outputted from this frequency multiplier and its conversion gain were measured, it was confirmed empirically that the output power and conversion gain had increased considerably. The specific construction and measurement results of this MMIC of the frequency multiplier are discussed in detail below in the section on preferred embodiments of the invention.

Accordingly, a first object of the present invention is to provide a frequency multiplier with which it is possible to increase the conversion gain and increase the output power of the multiplied output signal by adopting a construction such that the transistor operates at a point at which the nonlinearity of the input-output characteristic of the transistor is greater.

Now, when utilizing waves in the microwave frequency band or the millimeter wave frequency band, an oscillator for generating a high-frequency signal in that frequency band is necessary. When the high-frequency signal is to be frequency modulated (FM), as an oscillator of which the oscillation frequency can be variably controlled, for example a voltage controlled oscillator (VCO), whose oscillation frequency is variably controlled by means of an applied voltage, is used. FIGS. 20A, 20B, 21, and 22 show examples of conventional oscillator constructions. The basic construction of such an oscillator is shown in FIGS. 20A and 20B. FIG. 20A shows a band-pass type oscillator, and FIG. 20B shows a band-stop type oscillator.

As shown in FIGS. 20A and 20B, an oscillator 101 is made up of a negative resistance circuit 102 having a signal-amplifying action and a resonating circuit 103 which determines the oscillation frequency. In the negative resistance circuit 102, a feedback circuit wherein positive feedback is applied to an active device such as a transistor, or a device having negative resistance itself (for example a Gunn diode) is used. The resonating circuit 103 consists of, for example, a cavity resonator, a dielectric resonator or a plane resonator. The band-pass type oscillator 101 (FIG. 20A) is an oscillator in which the signal is taken from a resonating circuit 103 side, and the band-stop type oscillator 101 (FIG. 20B) is an oscillator in which the signal is taken from a negative resistance circuit 102 side.

In the oscillator constructed as described above, in the initial stage of oscillation a signal is passed back and forth between the negative resistance circuit and the resonating circuit, and by the signal being strengthened in the negative resistance circuit and a. frequency being selected in the resonating circuit a state of stationary oscillation at a set frequency is established. The output power at the time of the stationary oscillation depends on the amplifying capability of the negative resistance circuit, i.e. on the strength of the negative resistance. The strength of the negative resistance is generally evaluated using the resistance component of the impedance of the transistor seen from a point near the output terminal of the transistor in the feedback circuit of the negative resistance circuit. Because in an oscillator, normally, the higher the output power is the better, the feedback circuit is designed so that the negative resistance is a maximum.

In an oscillator of the construction described above, to variably control the oscillation frequency, all that is necessary is to change the frequency characteristics of either the negative resistance circuit or the resonating circuit. Here, an example of a voltage controlled oscillator (a band-stop type voltage controlled oscillator) is shown in FIG. 21. In the voltage controlled oscillator 101 shown in FIG. 21, a variable capacitance diode (hereinafter called a varactor) 104 is provided in the resonating circuit 103. By varying the capacitance of the varactor 104 by means of a voltage applied to a frequency control voltage terminal 105, the resonance frequency of the negative resistance circuit 102 is varied and the oscillation frequency of the voltage controlled oscillator 101 is thereby varied.

In this voltage controlled oscillator 101 using the varactor 104, by selecting a suitable varactor 104 according to the range over which the frequency is to be controlled, it is possible to set this frequency range relatively freely. However, when circuit miniaturization is attempted by making the whole voltage controlled oscillator 101 as a single integrated circuit, that is, when attempting to make it as a monolithic microwave integrated circuit (hereinafter abbreviated to MMIC), because the varactor 104 and the transistor (or Gunn diode) are devices made using different semiconductor film structures, it has been extremely difficult to make the whole voltage controlled oscillator 101 as an MMIC.

The construction of a voltage controlled oscillator, in which a varactor is not used and which is made as an MMIC, is disclosed in Japanese Patent Application Laid-Open No. S.62-207006. This voltage controlled oscillator made as an MMIC is shown in FIG. 22. FIG. 22 shows a band-pass type voltage controlled oscillator 101 wherein a transistor, for example a field effect transistor (hereinafter abbreviated to FET), 106 is provided in the negative resistance circuit 102. By varying the gate-source capacitance of the FET 106 by means of a gate bias voltage applied to the FET 106 through a frequency control voltage terminal 105 the resonance frequency of the resonating circuit 103 is varied and the oscillation frequency of the voltage controlled oscillator 101 is thereby varied.

In this construction, because transistors (FETs) made by using the same semiconductor film structure are used in both the negative resistance circuit 102 and the resonating circuit 103, it becomes possible to integrate the whole of the voltage controlled oscillator 101 onto a single semiconductor substrate, and making it as an MMIC becomes easy.

When a voltage controlled oscillator is used in a frequency modulation circuit, it is desirable that linearity (a proportional relationship) be maintained between the control voltage impressed on the voltage controlled oscillator and the oscillation frequency. Further, when frequency modulation is carried out using a voltage controlled oscillator, conventionally, the frequency modulation width has been of the order of a few MHz. As long as frequency modulation of this order is executed, there has been no problem in practice with the use of voltage controlled oscillators of the conventional constructions described above (oscillators using a varactor 104 or oscillators made as MMICs).

However, the present inventors envisaged setting the center frequency of the oscillation frequency range of a voltage controlled oscillator to a level of 30 GHz or 60 GHz and setting the frequency modulation width to several tens of MHz or more. Together with this, the inventors envisaged making a voltage controlled oscillator operated in this frequency band as an MMIC. To realize these objectives, the inventors produced by way of a trial a voltage controlled oscillator 111 of the circuit construction shown in FIG. 8. This voltage controlled oscillator 111 will now be described in detail. (FIG. 8 is a circuit diagram for illustrating a third preferred embodiment of the present invention, but because this trial-production voltage controlled oscillator 111 has the same circuit diagram as that shown in FIG. 8 it will be described using FIG. 8. Also, this trial-production voltage controlled oscillator 111 is not known technology at the time of application of the present invention.)

As shown in FIG. 8, the voltage controlled oscillator 111 consists of a negative resistance circuit 112 and a resonating circuit 113. The negative resistance circuit 112 is made up of as the transistor for example a high electron mobility transistor (hereinafter abbreviated to HEMT) 114, a transmission line 115 applying series feedback to the source of this HEMT 114, a matching circuit 116 and a D.C. cutoff capacitor 117. In this case, one end of the transmission line 115 is connected to the source of the HEMT 114 and the other end is grounded. The matching circuit 116 is made up of a transmission line 118, a stub 119 and a high-frequency grounding capacitor 120 connected in series.

One end of the transmission line 118 (the terminal on the opposite side from the terminal connected to the stub 119) is connected to the drain of the HEMT 114. The point of connection between the stub 119 and the high-frequency grounding capacitor 120 constitutes a voltage terminal 121 for supplying a drain bias. The other end of the high-frequency grounding capacitor 120 is grounded. Also, one end of the D.C. cutoff capacitor 117 is connected to the point of connection between the transmission line 118 and the stub 119, and the other end of this D.C. cutoff capacitor 117 constitutes an output terminal 122.

The resonating circuit 113 consists of a plane resonator made up of a transmission line 123 and a capacitor 124 connected in series. One end of the transmission line 123 (the terminal on the opposite side from the terminal connected to the capacitor 124) is connected to the gate of the HEMT 114. The point of connection between the transmission line 123 and the capacitor 124 constitutes a voltage terminal 125 for supplying a gate bias. This gate bias is a control voltage (i.e. a D.C. bias voltage) for controlling the oscillation frequency of the voltage controlled oscillator 111. The other end of the capacitor 124 is grounded.

The circuit elements (namely the HEMT 114, the transmission lines 115, 118 and 123, the stub 119 and the capacitors 117, 120 and 124) constituting the voltage controlled oscillator 111 described above are formed integrated on, for example, an InP substrate. In this way the voltage controlled oscillator 111 is made as an MMIC. This trial-production voltage controlled oscillator 111 is an MMIC for outputting a high-frequency oscillation signal in, for example, the 30 GHz band.

The HEMT 114 formed on the above-mentioned InP substrate is an HEMT in which an InAlAs/InGaAs pseudomorphic hetero-structure is used and of which the gate length is 0.5 $\mu$m, the unit gate width is 13 $\mu$m and the number of fingers is four. In making the MMIC, a coplanar line 126 of the construction shown in FIG. 9 was used for the transmission lines and the stubs. This coplanar line 126 is made up of a signal line 128 and ground electrodes 129 disposed on either side of this signal line 128, all disposed on an InP substrate 127. The signal line 128 and the ground electrodes 129 are for example made of gold. The width dimension Ws of the signal line 128 was made 50 $\mu$m and the spacing Wg between the signal line 128 and the ground electrodes 129 was made 43 $\mu$m. In this case, the wavelength of the 30 GHz high-frequency signal inside the coplanar line 126 was, according to calculation, about 3900 $\mu$m.

Also, in making the trial-production voltage controlled oscillator 111 (MMIC) described above, the inventors designed the feedback circuit so that the strength of the negative resistance (i.e. the feedback strength) of the negative resistance circuit 112 was maximized. The reason for designing it in this way is to maximize the output power of the high-frequency signal outputted by the voltage controlled oscillator 111 and to stabilize the output.

The strength of the negative resistance was found by calculating on the basis of results obtained when the respective S parameters of the HEMT 114, the capacitor 120 and the transmission line 115 were measured. Specifically, the absolute value of the negative resistance component (|Re (Za)|, where Re(Za)<0) was obtained by varying the length Lb of the transmission line 115 shown in FIG. 8 and calculating the impedance Za in a case where the HEMT 114 side is seen from the drain electrode of the HEMT 114, which is its output terminal.

As a result of this calculation, it was found that the negative resistance is at its strongest, i.e. the absolute value of the negative resistance component is at its greatest, when Lb=1121 $\mu$m. The value of the negative resistance in this case was Re(Za)=−104 $\Omega$. Accordingly, the inventors set the length Lb 20 of the transmission line 115 of the negative resistance circuit 112 to 1121 $\mu$m and set the length of the transmission line 123 of the resonating circuit 113 and the lengths of the transmission line 118 and the stub 119 of the matching circuit 116 to lengths such that a high-frequency signal in the 30 GHz band would be outputted, and thereby made the voltage controlled oscillator 111 (MMIC).

The inventors then measured the voltage (gate bias) vs. oscillation frequency characteristic of this voltage controlled oscillator 111. In this case, the drain bias impressed on the voltage terminal 121 was set to 2.5 V. The oscillation frequency and output power were then measured while the gate bias impressed on the voltage terminal 125 was changed in small steps from 0.20 V to −0.30 V. At this time, in the gate bias voltage range of from 0.00 V to −0.20 V the gate bias was changed in particularly small steps of for example 0.01 V, and in the rest of the gate bias voltage range the gate bias was changed in steps of for example 0.05 V.

The measurement results are shown plotted on a graph in FIG. 10. In FIG. 10, the rhomboid points show the frequency characteristic and the circular points show the output power characteristic. From FIG. 10, the inventors discovered that the trial-production voltage controlled oscillator 111 made as described above has the characteristic that its oscillation frequency changes in steps with respect to change in the gate bias. It could also be seen that the output power is about 1 to 2 dBm and therefore the output is amply large (i.e. maximized).

However, the characteristic that the oscillation frequency changes in steps like this shows that linearity of the change in the oscillation frequency with respect to the control voltage (the gate bias) is not being maintained. Therefore, this trial-production voltage controlled oscillator 111 cannot be used in a frequency modulation circuit.

The inventors then looked for a way of constructing a voltage controlled oscillator Ill realized as an MMIC by being made in the way described above so that the D.C. bias voltage (gate bias) and the oscillation frequency have linearity. The inventors focused on the feedback strength of the feedback circuit in the negative resistance circuit 112 of the voltage controlled oscillator 111. The inventors supposed that when the feedback strength of the feedback circuit is at a maximum, because the stability of oscillation is at its highest (the Q value is at its greatest), the oscillation frequency changes less easily, or, in other words, the oscillation frequency is difficult to variably control. Developing this idea, the inventors raised the hypothesis that if the stability of oscillation were to be reduced so that the oscillation frequency changes more easily then the control voltage (gate bias) and the oscillation frequency might come to have linearity.

To test this hypothesis, the inventors carried out the experiment of making a voltage controlled oscillator 111 (MMIC) wherein the feedback strength of the feedback circuit is made less than the maximum. When the voltage (gate bias) vs. oscillation frequency characteristic of this voltage controlled oscillator 111 was measured, it was confirmed empirically that linearity of the change in oscillation frequency with respect to the gate bias is amply maintained. A specific construction and measured results of this voltage controlled oscillator 111 (MMIC) wherein linearity is amply maintained are discussed in detail later in the section on preferred embodiments of the invention.

Accordingly, a second object of the invention is to provide a voltage controlled oscillator of a circuit construction such that it can easily be made as an MMIC and constructed so that the D.C. bias voltage and the oscillation frequency have linearity.

SUMMARY OF THE INVENTION

To achieve the above-mentioned first object, in a frequency multiplier according to the present invention, a transmission line of a predetermined length for producing a standing wave is provided between an output terminal of a transistor and an input terminal of a reflecting type fundamental wave signal band suppressing circuit. As a result of this, it is possible to raise the voltage acting on the output terminal of the transistor and the transistor operates at a point at which the nonlinearity of the input-output characteristic of the transistor is greater. As a result, the conversion gain increases and the output power of the multiplied output signal increases. Also, in this construction, because the transmission line having the function of producing a standing wave can be designed relatively simply just by adjusting its length, the frequency multiplier can be realized easily.

The length of the transmission line is set so that a fundamental wave signal outputted from the transistor and a signal resulting from the fundamental wave signal being reflected by the reflecting type fundamental wave signal band suppressing circuit and then reflected again at the output terminal of the transistor are in a phase relationship such that they strengthen each other. As a result of this, because the fundamental wave signal and its reflection signal are superimposed so that they strengthen each other, the voltage acting on the output terminal of the transistor becomes greater than when the above-mentioned transmission line is not present. Therefore, because the transistor operates at a point at which the nonlinearity of the input-output characteristic of the transistor is greater, the conversion gain and the output power of the frequency multiplier can be increased.

In the case of this construction, in practice the fundamental wave signal and its reflection signal can actually be put in a relationship such that they strengthen each other by the length of the transmission line being set so that the phase difference $\phi d$ lies in the range given by Exp. (1) below.

$$n \times 360 - 120 \leq \phi d \leq n \times 360 + 120 \tag{1}$$

where n is an integer.

As a result, it is possible to increase the conversion gain and raise the output power of the multiplied output signal.

Also, the length of the transmission line is preferably set so that the phase of the fundamental wave signal outputted from the transistor and the phase of the signal resulting from the fundamental wave signal being reflected by the reflecting type fundamental wave signal band suppressing circuit and then reflected again at the output terminal of the transistor are the same phase. When this is done, because the amplitude of the standing wave is maximized, the voltage acting on the output terminal of the transistor is also maximized. Therefore, because the transistor operates at the point at which the nonlinearity of the input-output characteristic of the transistor is at its maximum, the conversion gain can be made a maximum.

When a high-frequency signal of an even order is to be outputted as the multiplied output signal, the reflecting type fundamental wave signal band suppressing circuit is preferably made up of an open stub of length ¼ or a short stub of length ½ of the wavelength λ inside the transmission line corresponding to the fundamental wave signal frequency to be suppressed. As a result, it is possible to realize a reflecting type fundamental wave signal band suppressing circuit easily with a relatively simple construction.

When a high-frequency signal of an odd order is to be outputted as the multiplied output signal, the reflecting type fundamental wave signal band suppressing circuit is preferably made up of a band-pass filter having a function of attenuating a signal corresponding to the fundamental wave signal frequency to be suppressed. As a result, it is possible to realize the reflecting type fundamental wave signal band suppressing circuit easily with a relatively simple construction.

BRIEF DESCRIPTION OF THE DRAWINGS

These and other objects, features and characteristics of the present invention will be appreciated from a study of the following detailed description, the appended claims, and drawings, all of which form a part of this application. In the drawings, like reference numerals or labels representing similar parts throughout the several views:

DETAILED DESCRIPTION OF THE PREFERRED EMBODIMENTS

A first preferred embodiment of the present invention will now be described with reference to FIG. 1 through FIG. 4. The frequency multiplier of this first preferred embodiment is one for use for example as a part of a signal source for an FMCW type millimeter wave radar system, and has the function of doubling the frequency of an input signal (for example converting it from 30 GHz to 60 GHz). First, FIG. 1 is a view showing the circuit construction of the frequency multiplier 31 of this first preferred embodiment.

Figure 1:
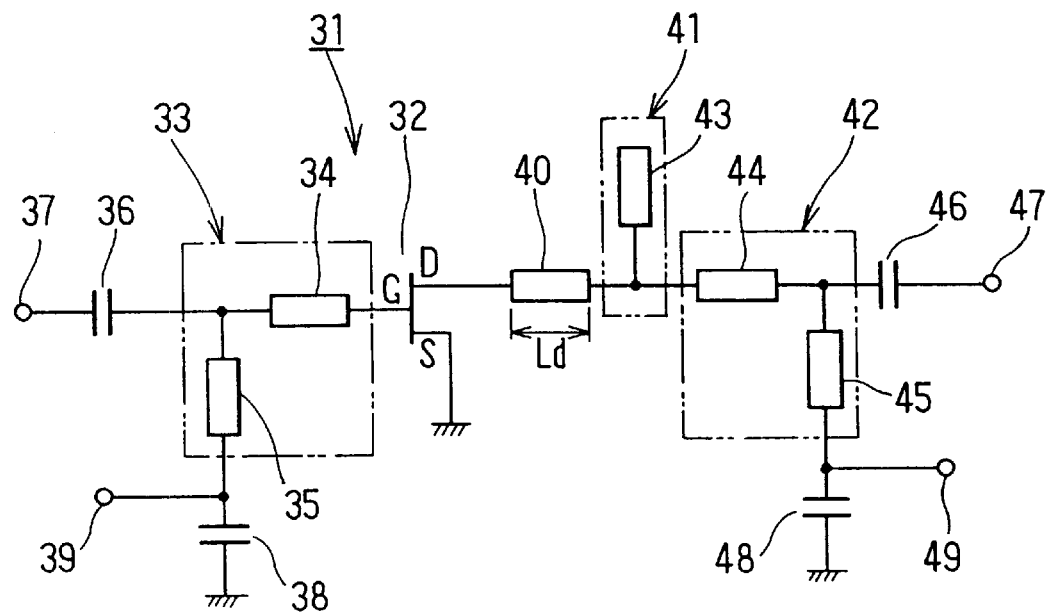
FIG. 1 is a circuit diagram showing a first preferred embodiment of the present invention.

As shown in FIG. 1, a transistor 32 serving as the active device of the frequency multiplier 31 is, for example, a high electron mobility transistor (hereinafter abbreviated to HEMT) in which is used an InAlAs/InGaAs pseudomorphic hetero-structure formed on an InP substrate. The gate length of this HEMT 32 is 0.5 $\mu$m, its unit gate width is 25 $\mu$m and its number of fingers is 2. The transistor's gate, drain, and source are labeled G, D, and S, respectively.

An input matching circuit 33 is connected to the gate of the HEMT 32. This input matching circuit 33 is made up of a transmission line 34 and a stub 35 connected to the transmission line 34. In this case, the transmission line 34 and the stub 35 of the input matching circuit 33 are constructed to provide matching with respect to a 30GHz band input signal. One end of the transmission line 34 (the terminal on the side not connected to the stub 35) is connected to the gate of the HEMT 32. The point of connection between the transmission line 34 and the stub 35 is connected to one end of a capacitor 36, the other end of this capacitor 36 is made an input terminal 37, and an input signal is inputted to this input terminal 37. Also, the other end (the terminal on the side not connected to the transmission line 34) of the stub 35 is grounded by way of a capacitor 38 and also is made a voltage terminal 39 for supplying a gate bias.

The drain of the HEMT 32 constitutes the output terminal of the transistor, and one end of a transmission line 40, having a lenth Ltd, for producing a standing wave is connected to this drain. The specific construction of this transmission line 40 and its operation will be further discussed later. A reflecting type fundamental wave signal band suppressing circuit 41 and the input terminal of an output matching circuit 42 are connected to the other end of the transmission line 40.

The reflecting type fundamental wave signal band suppressing circuit 41 consists of an open stub 43 of length ¼ of a wavelength inside the line corresponding to the frequency of the fundamental wave signal (in the case of this preferred embodiment, 30 GHz). The end of this open stub 43 is the input terminal of the reflecting type fundamental wave signal band suppressing circuit 41 and is connected to the above-mentioned other end of the transmission line 40. The output matching circuit 42 is made up of a transmission line 49 and a stub connected to the transmission line 44. In this case, the transmission line 44 and the stub 45 of the output matching circuit 42 are constructed to provide matching with respect to a 60 GHz band output signal. One end of the transmission line 44 (the terminal not connected to the stub 45) is connected to the above-mentioned other end of the transmission line 40. The point of connection between the transmission line 44 and the stub 45 is connected to one end of a capacitor 46, and the other end of this capacitor 46 is made an output terminal 47. A multiplied output signal (in the case of this preferred embodiment, a signal of frequency 60 GHz) is outputted through this output terminal 47.

The other end (the terminal on the side not connected to the transmission line 44) of the stub 45 is grounded by way of a capacitor 48. The point of connection between the capacitor 48 and the stub 45 constitutes a voltage terminal 49 for supplying a drain bias. The source of the HEMT 32 is also grounded.

The circuit elements making up the frequency multiplier 31 described above (namely the HEMT 32, the transmission lines 34, 40 and 44, the stubs 35, 43 and 45, the capacitors 36, 38, 46 and 48 and the terminals 37, 38, 47 and 49) are formed integrated on the InP substrate, and in this way the frequency multiplier 31 is made as an MMIC. That is, the frequency multiplier 31 is an MMIC (chip) for inputting a 30 GHz band input signal and outputting a 60 GHz (doubled) output signal.

Figure 2:
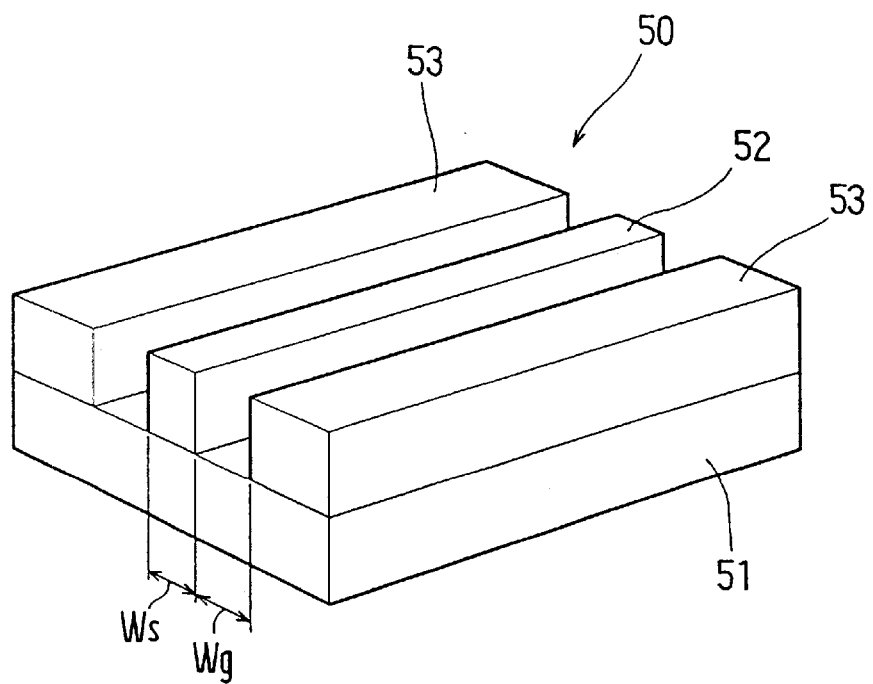
FIG. 2 is a perspective view of a coplanar line.

In making this MMIC, a coplanar line 50 of the construction shown in FIG. 2 was used as the transmission lines and the stubs. This coplanar line 50 is made up of a signal line 52 disposed on an InP substrate 51 and ground electrodes 53 disposed on opposite sides of this signal line 52. Here, the signal line 52 and the ground electrodes 53 are for example made of gold. The width dimension Ws of the signal line 52 is 50 $\mu$m and the spacing Wg between the signal line 52 and the ground electrodes 53 is 43 $\mu$m. In the case of this construction, the wavelength (the in-line wavelength) of the 30 GHz high-frequency signal inside the coplanar line 50 is, according to calculation, about 3900 $\mu$m.

Figure 4:
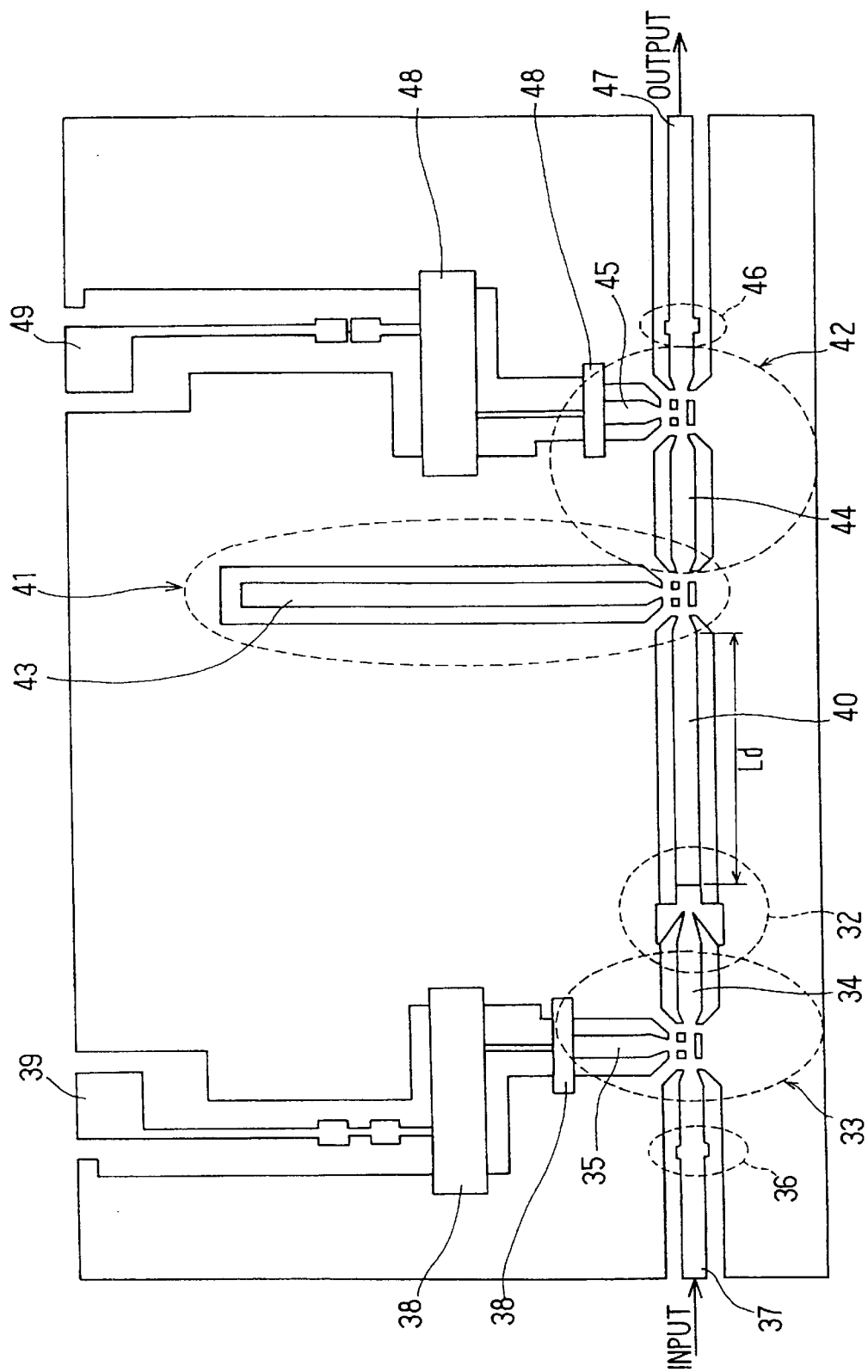
FIG. 4 is a view showing the circuit pattern of a frequency multiplier.

Here, the actual circuit pattern of the frequency multiplier (MMIC) 31 constructed as described above is shown in FIG. 4. The parts shown with reference numerals in this FIG. 4 are the same as the parts shown with the same reference numerals in FIG. 1 and will not be described in detail for FIG. 4. Input 37 and output 47 are labeled "INPUT", respectively. The chip size of the MMIC (frequency multiplier) 31 described above is 2.7×1.7 mm.

Figure 3:
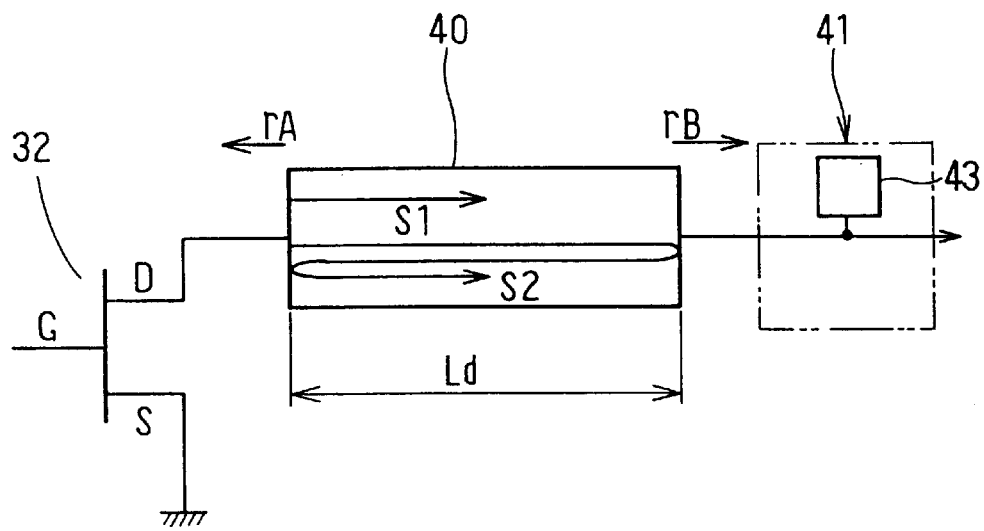
FIG. 3 is a view illustrating the operation of a transmission line.

Next, the operation by which the transmission line 40 produces a standing wave will be described with reference also to FIG. 3. As shown in FIG. 3, in the transmission line 40, a standing wave is produced by a fundamental wave signal S1 outputted from the drain of the HEMT 32 and a signal S2 resulting from the fundamental wave signal being reflected by the reflecting type fundamental wave signal band suppressing circuit 41 and reflected again at the drain of the HEMT 32. The amplitude of this standing wave is superimposed on the output signal outputted from the drain of the HEMT 32 (the output signal consisting of the multiplied output signal and the unwanted signal including the fundamental wave signal S1).

As a result, the voltage acting on the drain of the HEMT 32 is increased by an amount corresponding to the amplitude of the standing wave and the HEMT 32 operates at a point at which the nonlinearity of the input-output characteristic of the HEMT 32 is greater. Consequently, the conversion gain of the frequency multiplier 31 rises and the output power of the multiplied output signal increases.

The conditions under which the above-mentioned two signals S1 and S2 have a phase relationship such that they strengthen each other will now be considered. First, when the phase difference $\phi d$ between the two signals S1 and S2 lies within the range defined by Exp. (1) below, the two signals S1 and S2 are in a phase relationship such that they strengthen each other and the amplitude of the standing wave is large.

$$n \times 360 - 120 \leq \phi d \leq n \times 360 + 120 \quad (1)$$

where n is an integer.

Therefore, all that is necessary is that the length of the transmission line 40 be so set (designed) so that Exp. (1) holds. Here, the phase difference $\phi d$ is defined by Exp. (2):

$$\phi d = (2 \times \phi L) + \phi A + \phi B \quad (2)$$

In this Exp. (2), $\phi L$ is the phase lag of the fundamental wave signal S1 corresponding to the length Ld of the transmission line 40. This phase lag $\phi L$ (degrees) is given by Exp. (3):

$$\phi L = (Ld/\lambda) \times 360 \quad (3)$$

In Exp. (3), $\lambda$ is the wavelength of the fundamental wave signal S1 inside the transmission line 40 (the in-line wavelength), and in the case of this preferred embodiment is about 3900 $\mu$m.

Also, in Exp. (2), $\phi A$ is the phase characteristic in the reflection coefficient $\Gamma A$ (see FIG. 3) of the drain of the HEMT 32 as seen from the transmission line 40, and $\phi B$ is the phase characteristic in the reflection coefficient $\Gamma B$ (see FIG. 3) of the reflecting type fundamental wave signal band suppressing circuit 41, i.e. the input terminal of the open stub 43, as seen from the transmission line 40.

In this connection, the present inventors measured the above-mentioned two reflection coefficients $\Gamma A$, $\Gamma B$ for a 30 GHz fundamental wave signal S1. The measurement results are shown below.

reflection coefficient $\Gamma A$: $0.7252 \angle -29.7621°$ reflection coefficient $\Gamma B$: $1.0 \angle 180°$ In this case, the '0.7252' of the reflection coefficient $\Gamma A$ is amplitude characteristic and the '$-29.7621°$' is phase characteristic. Similarly, the '1.0' of the reflection coefficient $\Gamma B$ is amplitude characteristic and the '180°' is phase characteristic.

When the length Ld of the transmission line 40 in the case of n=1 is obtained from these measured values of the phase characteristics of the reflection coefficients $\Gamma A$, $\Gamma B$ and Exps. (1), (2) and (3) above, this length Ld lies in the range given by Exp. (4):

$$486.21(\mu m) \leq Ld \leq 1786.21(\mu m) \quad (4)$$

Therefore, if the frequency multiplier (MMIC) 31 is made with the length Ld of the transmission line 40 set so as to lie within the range of Exp. (4), in the transmission line 40 the two signals S1 and S2 are in a phase relationship such that they strengthen each other and a standing wave of ample amplitude is produced.

Accordingly, as frequency multipliers of which the length Ld of the transmission line 40 is within the range given by Exp. (4), the inventors made a frequency multiplier 31 wherein the length Ld was set to 500 $\mu$m and a frequency multiplier 31 wherein the length Ld was set to 600 $\mu$m, and as a frequency multiplier wherein the length Ld is not within the range given by Exp. (4) they made a frequency multiplier 31 wherein the length Ld was set to 250 $\mu$m. The conversion gains of these three frequency multipliers 31 were then measured. The measurement results are shown in Table 1.

TABLE 1

| transmission line length Ld ($\mu$m) | phase difference $\phi d$ (°) | conversion gain (dB) |
| --- | --- | --- |
| 250 | 196.45 | −10.6 |
| 500 | 242.6 | −5.5 |
| 600 | 261.06 | −5.44 |

From this table 1, it can be seen that the conversion gain is considerably higher in the cases wherein the length Ld was set to 500 $\mu$m and 600 $\mu$m compared to the case wherein the length Ld was set to 250 $\mu$m. That is, compared to when the phase difference $\phi d$ of the two signals S1 and S2 is near 180° (when the signal S1 and the signal S2 are nearly in opposite phase), the conversion gain is much greater when the phase difference $\phi d$ has moved away from 180° and moved toward 360° (when the signal S1 and the signal S2 have approached the same phase). In this way, it was confirmed that when the phase difference $\phi d$ is within the range defined by Exp. (1) the conversion gain increases.

When the phase difference $\phi d$ becomes 360°, that is, when the signal S1 and the signal S2 have the same phase, because the amplitude of the standing wave produced in the transmission line 40 is at a maximum, the conversion gain can also be expected to be at a maximum. It can be found by calculation that, to set the phase difference $\phi d$ to 360°, all that is necessary is to set the length Ld of the transmission line 40 to about 1100 $\mu$m. Therefore, if the frequency multiplier 31 is made with the length Ld of the transmission line 40 set to about 1100 $\mu$m, the frequency multiplier 31 wherein the conversion gain is maximized can be realized.

In this case, because it is desirable for the chip of a frequency multiplier 31 made as an MMIC to be as small in size as possible, if the length Ld of the transmission line 40 is set to about 1100 $\mu$m as described above, the problem arises that the chip size becomes rather large. Because of this, in practice, due to restrictions on chip size, a (trial production) frequency multiplier 31 wherein the length Ld of the transmission line 40 is set to about 500 $\mu$m or 600 $\mu$m is the most preferable construction.

Although in the preferred embodiment described above the frequency multiplier 31 was constructed as a frequency doubler, it is not limited to this and can for example also be constructed as a frequency quadrupler. Specifically, to make a frequency quadruplet for inputting a 15 GHz band input signal and outputting a 60 GHz band multiplied output signal, all that is necessary is to construct the input matching circuit 33 to provide matching in the 15 GHz band, construct the output matching circuit 42 to provide matching in the 60 GHz band, and make an open stub of length ¼ of the in-line wavelength $\lambda$ of 15 GHz in the reflecting type fundamental wave signal band suppressing circuit 41.

Figure 5:
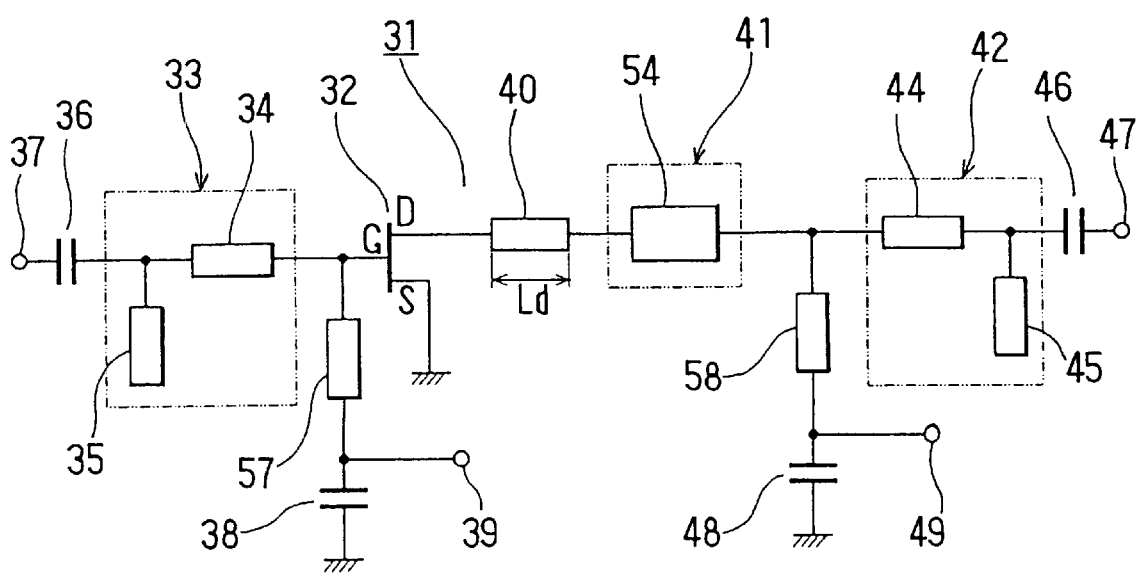
FIG. 5 is a circuit diagram showing a second preferred embodiment of the present invention.
Figure 6:
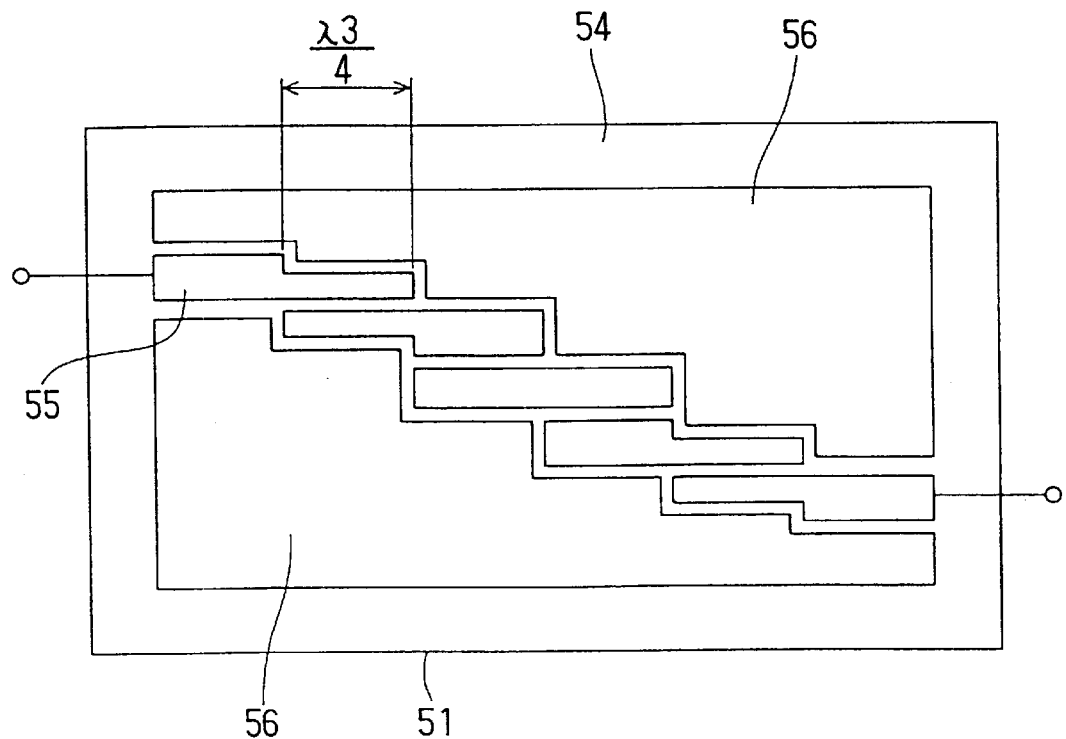
FIG. 6 is a view showing the circuit pattern of a band-pass filter.
Figure 7:
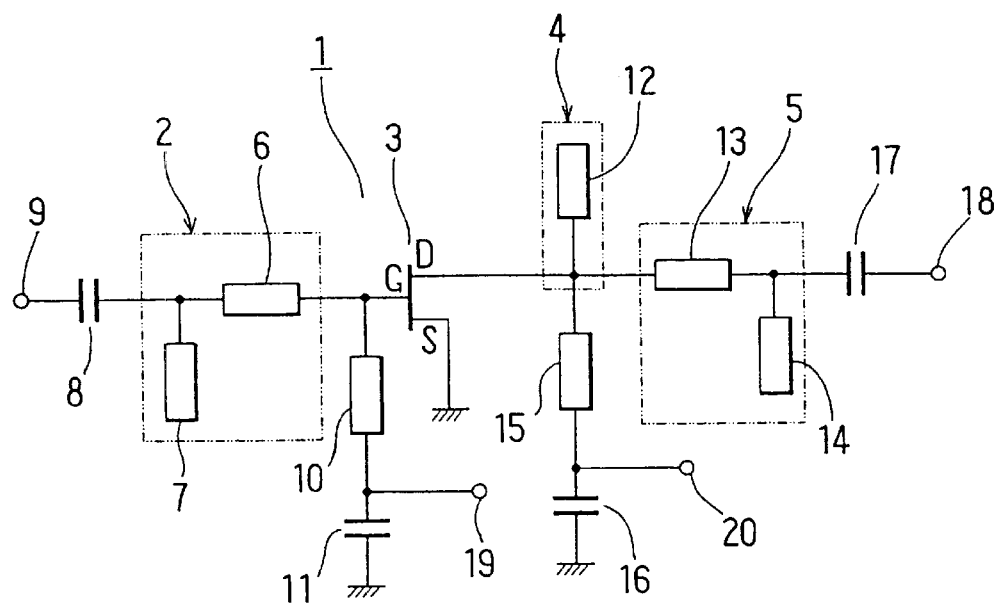
FIG. 7 is a circuit diagram showing the construction of a conventional frequency multiplier.
Figure 8:
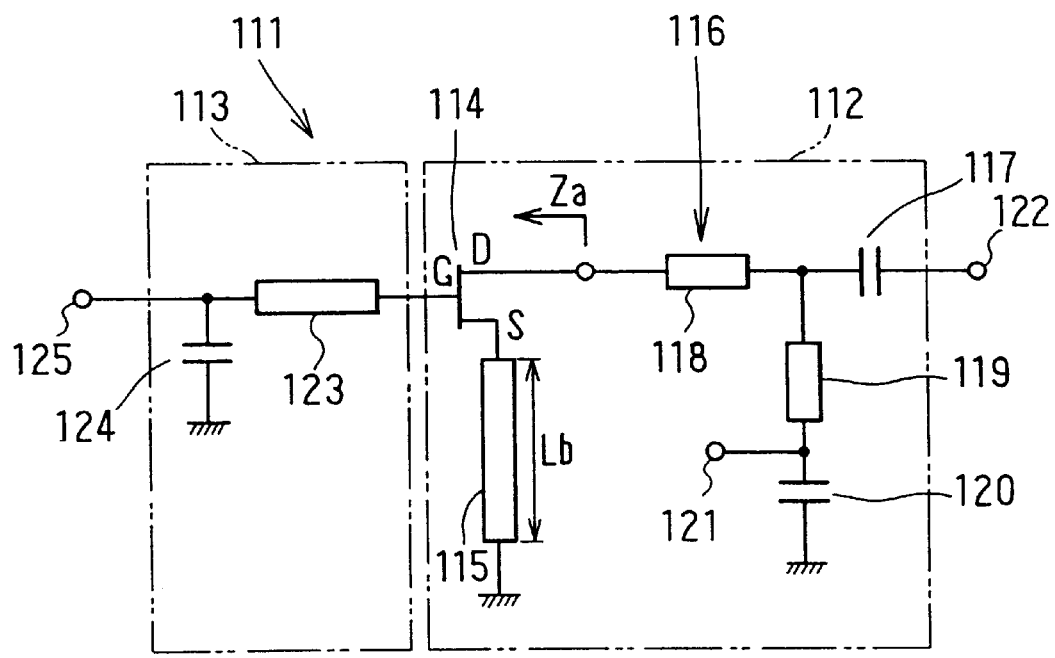
FIG. 8 is a circuit diagram showing a third preferred embodiment of the present invention.
Figure 9:
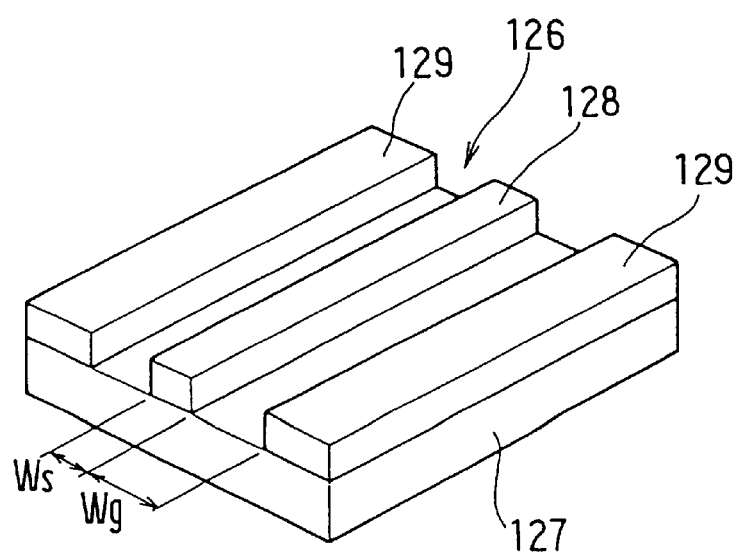
FIG. 9 is a perspective view of a part of a coplanar line.
Figure 10:
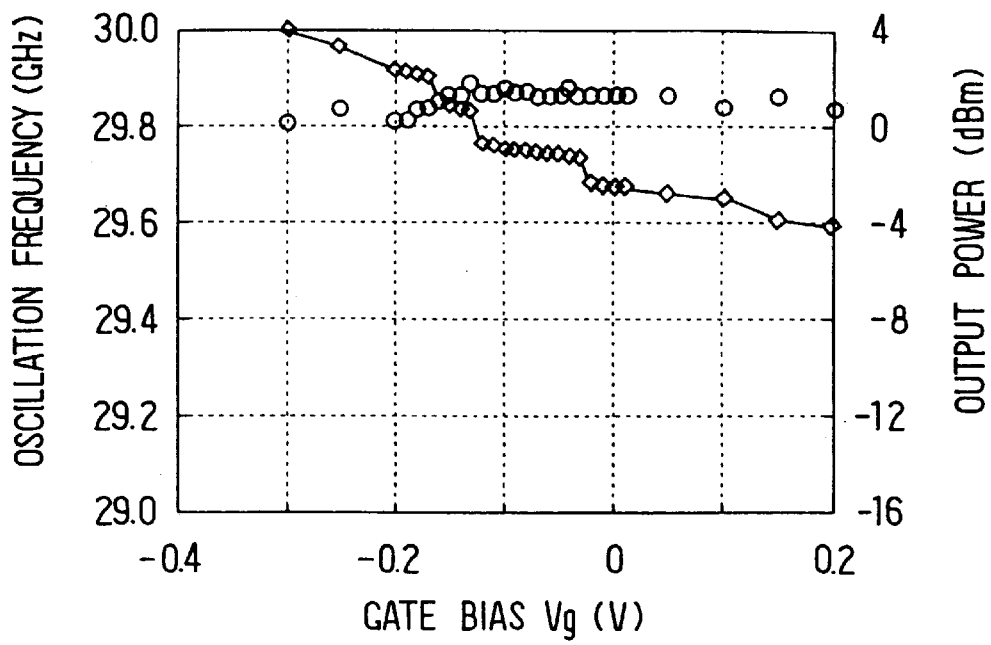
FIG. 10 is a chart showing characteristics of a trial-production voltage controlled oscillator.

FIG. 5 and FIG. 6 show a second preferred embodiment of the invention, and the features of this second preferred embodiment that are different from the first preferred embodiment will now be described. Parts of this second preferred embodiment which are the same as those of the first preferred embodiment have been given the same reference numerals. The frequency multiplier 31 of this second preferred embodiment is a tripler for inputting a 20 GHz band input signal and outputting a 60 GHz band multiplied output signal, and has a construction outputting a so-called odd-order high-frequency signal.

In this frequency multiplier 31, the input matching circuit 33 is constructed to provide matching in the 20 GHz band and the output matching circuit 42 is constructed to provide matching in the 60 GHz band. The reflecting type fundamental wave signal band suppressing circuit 41 is composed of a band-pass filter 54 which passes 60 GHz band signals. The circuit pattern of this band-pass filter 54 is shown in FIG. 6. The band-pass filter 54 is made up of a plurality of island-shaped signal lines 55 formed staggered in the form of a staircase on an InP substrate 51 and ground electrodes 56 formed on opposite sides of these signal lines 55. The $\lambda 3/4$ shown in FIG. 6 represents the in-line wavelength of the 60 GHz band frequency signal.

In this frequency multiplier 31, as shown in FIG. 5, one end of a transmission line 57 is connected to the gate of the HEMT 32 and the other end of this transmission line 57 is grounded by way of a capacitor 38. The point of connection between the transmission line 57 and the capacitor 38 is made as a voltage terminal 39 for supplying a gate bias. One end of a transmission line 58 is connected to the drain of the HEMT 32 through the transmission line 40 and the reflecting type fundamental wave signal band suppressing circuit 41, and the other end of this transmission line 58 is grounded through a capacitor 48. The point of connection between the transmission line 58 and the capacitor 48 is made as a voltage terminal 49 for supplying a drain bias.

Otherwise, the construction of the second preferred embodiment is the same as that of the first preferred embodiment and need not be described in further detail. Therefore, with this second preferred embodiment also it is possible to obtain substantially the same operation and effects as with the first preferred embodiment.

In the preferred embodiments described above an InP substrate was used, but instead of this a GaAs substrate may be used. Also, although in the preferred embodiments described above the transmission lines and the stubs were made using the coplanar line 50, they may alternatively be made by using microstrip lines. Also, although in the preferred embodiments described above the transistor was the HEMT 32, it is not limited to this and may alternatively be another FET (field effect transistor) or may be a bipolar transistor (for example a heterobipolar transistor).

Also, although in the preferred embodiments described above one frequency multiplier was constructed as one MMIC chip, alternatively a frequency multiplier and a voltage controlled oscillator for supplying an input signal to the frequency multiplier can be constructed as a single MMIC chip, or a frequency multiplier and an amplifying circuit for amplifying the signal outputted from the frequency multiplier can be constructed as a single MMIC chip, or a voltage controlled oscillator, a frequency multiplier, and an amplifying circuit can all be constructed as one MMIC chip.

Also, although in the preferred embodiments described above the invention was applied to a frequency multiplier constituting a part of a signal source for a millimeter wave radar system, it is not limited to this and may for example alternatively be applied to a frequency multiplier constituting a part of a signal source for a communication system using microwaves or millimeter waves.

Next, a voltage controlled oscillator according to a third preferred embodiment of the present invention will be described with reference to FIG. 8 through FIG. 12. The circuit construction of the voltage controlled oscillator of this third preferred embodiment is basically the same as the circuit construction of the voltage controlled oscillator 111 made by the inventors by way of a trial described above in the sections 'Description of the Related Art' and 'Summary of the Invention'. The point of difference is that the voltage controlled oscillator of this third preferred embodiment is constructed so that the strength of the negative resistance (i.e. the absolute value of the negative resistance component) of the negative resistance circuit 112 is smaller than the maximum. The voltage controlled oscillator 111 of this third preferred embodiment will now be described specifically with reference to FIG. 8.

First, the circuit construction of the voltage controlled oscillator 111 will be briefly described. The voltage controlled oscillator 111 is made up of a negative resistance circuit 112 and a resonating circuit 113. The negative resistance circuit 112 is made up of a HEMT 114, a transmission line 115, a matching circuit 116 and a D.C. cutoff capacitor 117. The matching circuit 116 is made up of a transmission line 118, a stub 119, and a high-frequency grounding capacitor 120. A point of connection between the stub 119 and the high-frequency grounding capacitor 120 constitutes a voltage terminal 121 for supplying a drain bias. One end of the D.C. cut capacitor 117 is connected to the point of connection between the transmission line 118 and the stub 119, and the other end of this D.C. cut capacitor 117 constitutes an output terminal 122.

The resonating circuit 113 consists of a plane resonator having a transmission line 123 and a capacitor 124. One end of the transmission line 123 is connected to the gate of the HEMT 114 of the negative resistance circuit 112. A point of connection between the transmission line 123 and the capacitor 124 constitutes a voltage terminal 125 for supplying a gate bias. This gate bias is a control voltage, i.e. a D.C. bias voltage, for controlling the oscillation frequency of the voltage controlled oscillator 111.

In the circuit construction of the voltage controlled oscillator 111 described above, the strength of the negative resistance of the negative resistance circuit 112 is made smaller than the maximum. Specifically, the length Lb of the transmission line 115 is set to 1048 $\mu$m. This length Lb=1048 $\mu$m is a length about 70 $\mu$m shorter than the length Lb=1121 $\mu$m (the condition at which the strength of the negative resistance is the maximum) of the transmission line of the voltage controlled oscillator made by way of a trial. The length of this shortening (about 70 $\mu$m) is a length corresponding to about 2% of the wavelength inside the transmission line 115. The wavelength inside the transmission line 115 can be obtained by calculation. In the case of this preferred embodiment, because the transmission line 115 consists of the coplanar line 126 shown in FIG. 9, it was calculated by a known calculation method from the width dimension Ws of the signal line 128 and the spacing Wg between the signal line 128 and the ground electrodes 129 of the coplanar line 126. According to this calculation, the wavelength inside the transmission line 115 is about 3900 $\mu$m.

When the length Lb of the transmission line 115 of the negative resistance circuit 112 was set to 1048 $\mu$m as described above, the value of the negative resistance became Re(Za)=−96 ($\Omega$). From this it can be seen that the strength of the negative resistance of the negative resistance circuit 112 has shifted to below the maximum of (Re(Za)=−104

(Ω)). In other words, it can be seen that the feedback strength of the feedback circuit of the negative resistance circuit 112 has been set smaller than its maximum.

Figure 12:
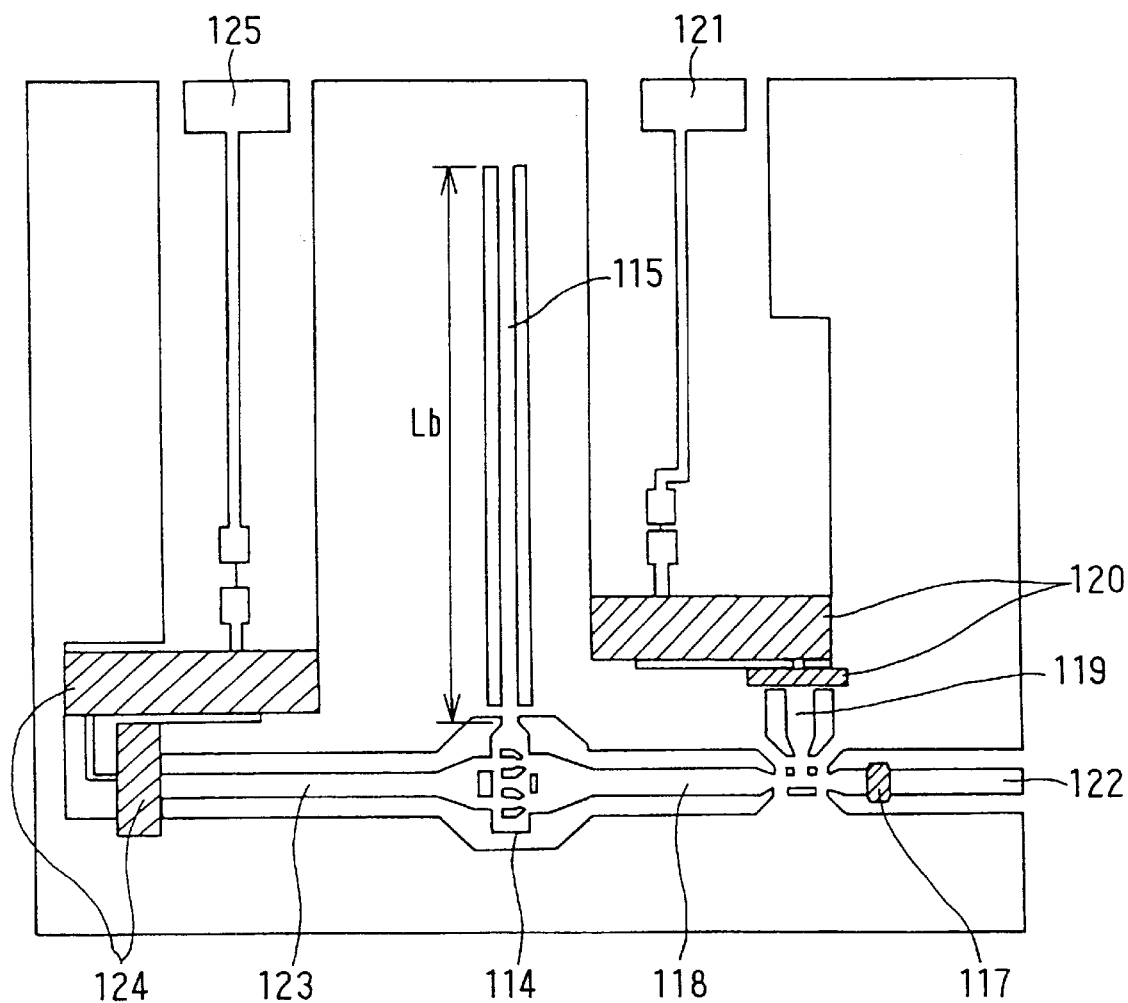
FIG. 12 is a view showing an enlarged circuit pattern of an MMIC.

Because when the length Lb of the transmission line 115 of the negative resistance circuit 112 is changed the conditions for the resonating circuit 113 and the matching circuit 116 also change, the length of the transmission line 123 of the resonating circuit 113 and the lengths of the transmission line 118 and the stub 119 of the matching circuit 116 were adjusted so that a 30 GHz band high-frequency signal was outputted. Also, the voltage controlled oscillator 111 (consisting of the HEMT 114, the transmission lines 115, 118 and 123, the stub 119 and the capacitors 117, 120 and 124) is formed integrated on an InP substrate and thus constitute an MMIC. The actual circuit pattern of this MMIC is shown in FIG. 12. The parts shown with reference numerals in this FIG. 12 are the same as the parts shown with the same reference numerals in FIG. 8 and will not be described in detail for FIG. 12. In FIG. 12, the regions shown with hatching denote capacitors.

The control voltage (gate bias) vs. oscillation frequency characteristic of the voltage controlled oscillator 111 constructed as described above was measured. In this case, the drain bias impressed on the voltage terminal 121 was set to 2.5 V. The oscillation frequency and output power were then measured while the gate bias impressed on the voltage terminal 125 was changed in small steps from 0.20 V to −0.30 V. Specifically, the gate bias was changed in steps of 0.01 V.

Figure 11:
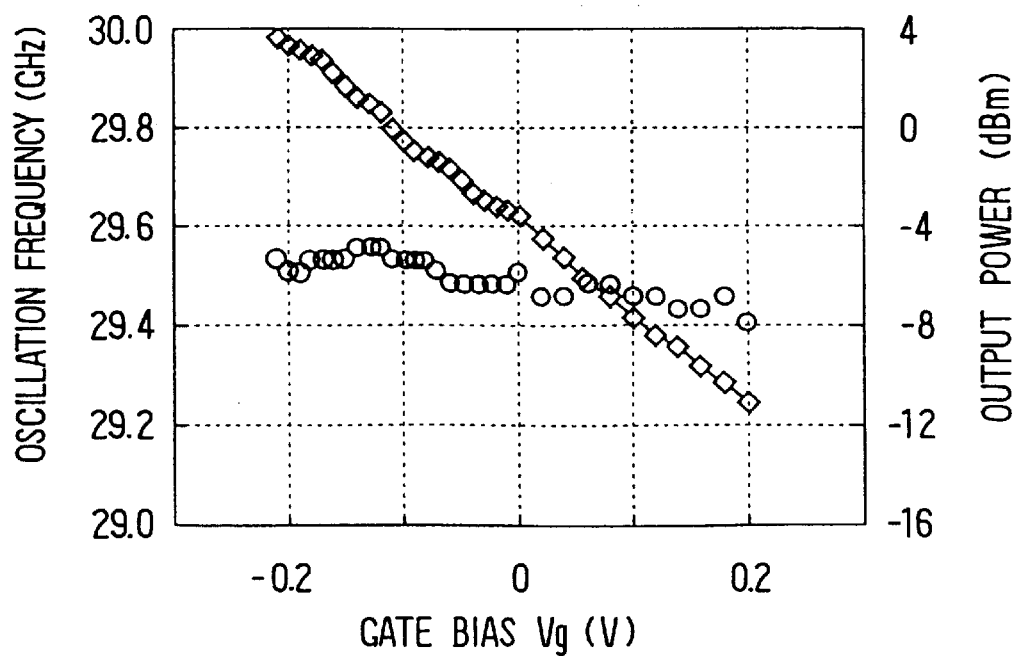
FIG. 11 is a chart showing characteristics of the third preferred embodiment.

These measurement results are shown plotted on a graph in FIG. 11. In this FIG. 11, the rhomboid points show the frequency characteristic and the circular points show the output power characteristic. FIG. 11 shows clearly that in the voltage controlled oscillator 111 of the third preferred embodiment the oscillation frequency changes linearly with respect to change in the gate bias, i.e. that the gate bias (D.C. bias voltage) and the oscillation frequency have extremely good linearity. It can also be seen that in the third preferred embodiment described above, because the negative resistance of the negative resistance circuit 112 has been weakened, the output power has moved to the range of about −7 dB to −5 dB, that is, the output power has fallen.

Although in this preferred embodiment the length Lb of the transmission line 115 of the negative resistance circuit 112 was shortened by a length corresponding to about 2% of the wavelength inside the transmission line 115 and set to 1048 μm, the invention is not limited to this and the length Lb of the transmission line 115 of the negative resistance circuit 112 may be set still shorter than the above-mentioned 1048 μm. Specifically, the present inventors made a voltage controlled oscillator (MMIC) 111 wherein the length Lb of the transmission line 115 is shortened by a length corresponding to about 6%. of the wavelength inside the transmission line 115 and set to 891 μm. It was then confirmed by measurement that the gate bias (D.C. bias voltage) and the oscillation frequency have extremely good linearity in this voltage controlled oscillator 111 also.

The experimental results obtained with the two voltage controlled oscillators of the third preferred embodiment described above and with the trial-production voltage controlled oscillator are shown summarized in Table 2 below.

TABLE 2

| Lb | proportion of shortening length to wavelength | Re (Za) | oscillation output | linearity | remarks |
|---|---|---|---|---|---|
| a | 1121 μm | — | −104Ω | 1 dBm | bad (step-like) | Max feedback |
| b | 1048 μm | −2% | −96Ω | −5 dBm | good | |
| c | 891 μm | −6% | −68Ω | −14.5 dBm | good | |

As is clear from this table 2, if the length Lb of the transmission line 115 is shortened to reduce the amount of feedback of the feedback circuit, i.e. if the absolute value of the negative resistance of the feedback circuit is reduced, the gate bias (D.C. bias voltage) and the oscillation frequency have linearity. From the table 2, it can also be seen that as the length Lb is shortened further, although linearity is not lost, the output power (oscillation output) decreases rapidly.

Also, according to the table 2, the maximum value of the length Lb of the transmission line 115 with which there is linearity is obtained when the length is made shorter than the length (Lb=1121 μm) of the transmission line which gives the maximum negative resistance strength by about 2% of the wavelength inside the transmission line 115. Because the voltage controlled oscillator thus constructed gives the largest output power it is the most suitable for using as an oscillator. However, although the inventors did not make a voltage controlled oscillator 111 wherein the length Lb of the transmission line 115 was made shorter than the length at which the strength of the negative resistance is the maximum by a length corresponding to about 1% or about 1.5% of the wavelength inside the transmission line 115, it is preferable to make voltage controlled oscillators 111 having transmission lines 115 of such lengths and check for each one whether or not it has linearity. In other words, because at the present time there is no theoretical backing, the only method of determining the boundary condition between oscillators having linearity and those not having linearity is to actually make voltage controlled oscillators 111 having different conditions and check by experiment for each one whether or not there is linearity.

Because it is desirable for the output power of an oscillator to be as high as possible, the oscillator of which the length Lb of the transmission line 115 is the longest, i.e. of which the feedback strength of the feedback circuit is the greatest, among the voltage controlled oscillators (MMICs) found to have linearity, is preferably used.

Although in the third preferred embodiment described above the center value of the oscillation frequency of the voltage controlled oscillator 111 was set to 30 GHz, the invention is not limited to this and the center value of the oscillation frequency may be set higher than 30 GHz (for example to 60 GHz) or may be set lower than 30 GHz.

Also, although in the third preferred. embodiment described above an InP substrate was used, instead of this a GaAs substrate may be used. And although in the third preferred embodiment described above the transmission lines were made using coplanar lines, they may alternatively be made by using microstrip lines. Furthermore, while in the third preferred embodiment described above the transistor of the negative resistance circuit 112 was made the HEMT 114, it is not limited to this and may alternatively be made another FET (field effect transistor) or may be made a bipolar transistor (for example a heterobipolar transistor).

Also, although in the third preferred embodiment described above the feedback strength of the feedback circuit was shifted from its maximum by the length of the transmission line 115 of the negative resistance circuit 112 being shortened, the invention is not limited to this and alternatively the length of the transmission line 115 may be left at the length at which the strength of the negative resistance is the maximum and linearity may instead be provided by reducing the oscillation output by adjusting the lengths of the other transmission lines and the stubs or the capacitances of the capacitors. Also, although in the third preferred embodiment described above the resonating circuit 113 was made by a plane resonator, instead of this it may be made by a dielectric resonator, a diode resonator or a cavity resonator.

Figure 13:
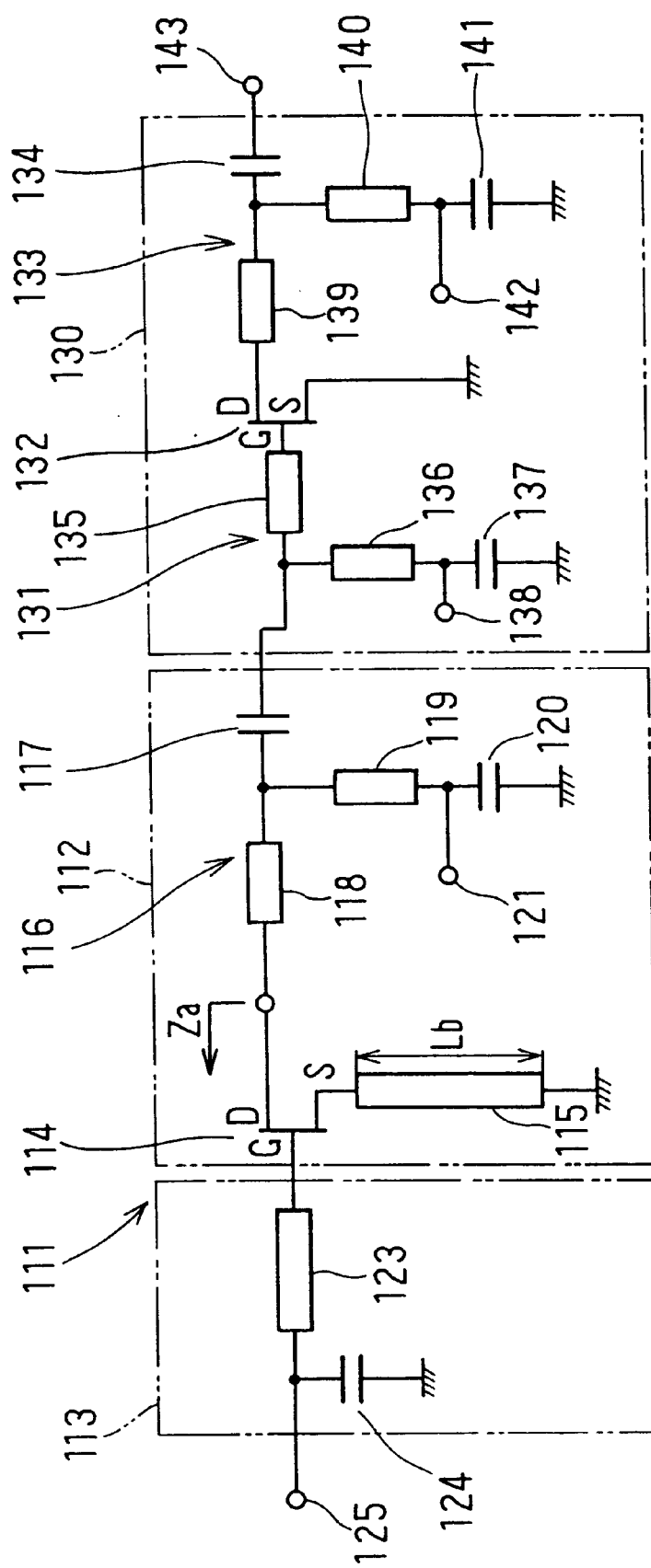
FIG. 13 is a circuit diagram showing a fourth preferred embodiment of the present invention.
Figure 14:
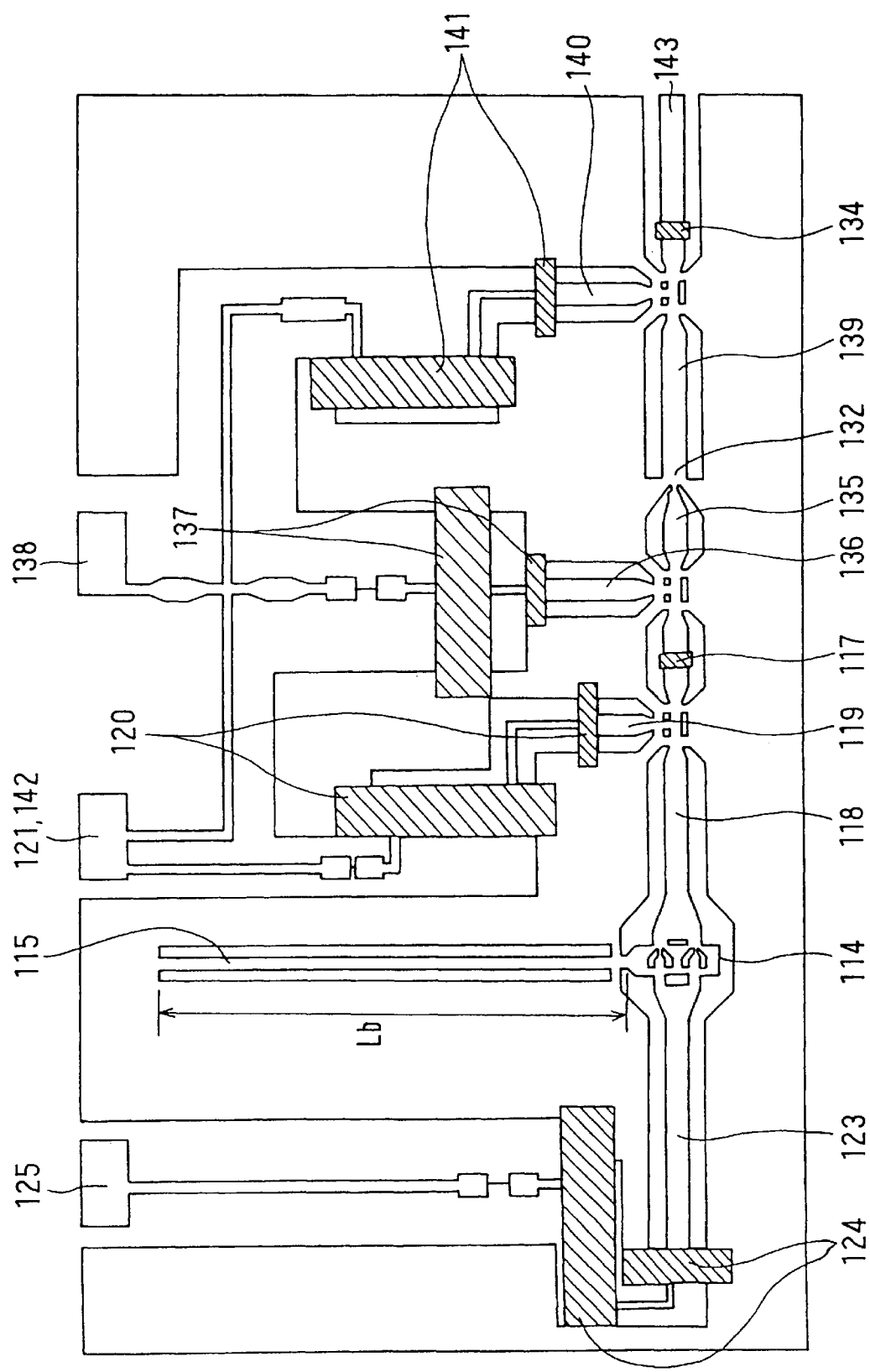
FIG. 14 is a view showing an enlarged circuit pattern of an MMIC of the fourth preferred embodiment.
Figure 15:
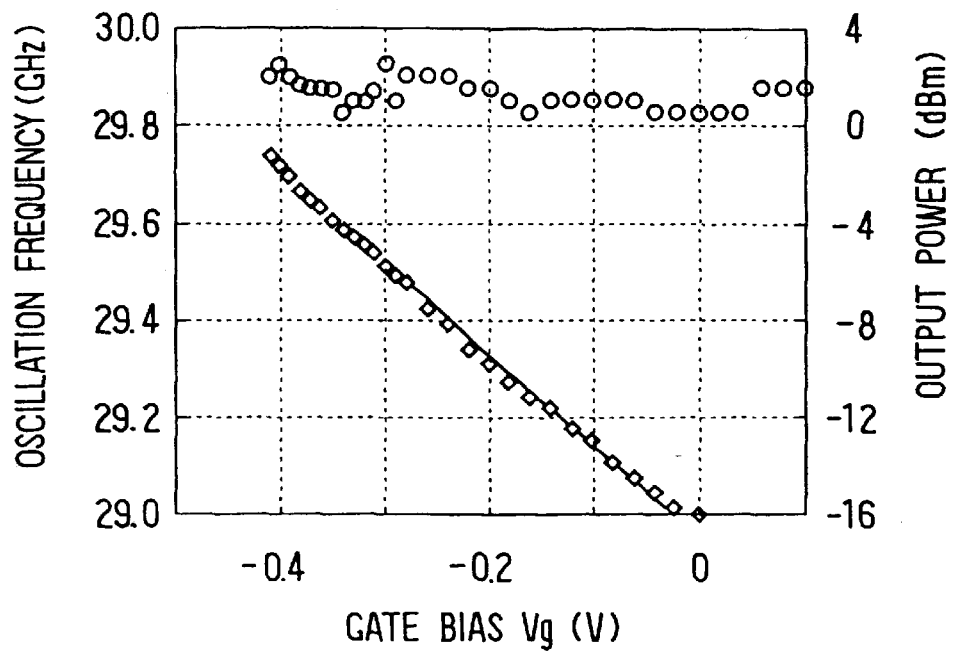
FIG. 15 is a chart showing characteristics of the fourth preferred embodiment.

FIG. 13 through FIG. 15 show a fourth preferred embodiment of the present invention, and the features of this fourth preferred embodiment that are different from the third preferred embodiment will now be described. In these figures, parts the same as parts of the third preferred embodiment have been given the same reference numerals. In this fourth preferred embodiment, an amplifying circuit 130 for amplifying the oscillation output of a voltage controlled oscillator 111 according to the third preferred embodiment is provided, and this amplifying circuit 130 and the voltage controlled oscillator 111 are constructed as a single MMIC.

As shown in FIG. 13, the amplifying circuit 130 is made up of an input matching circuit 131, an HEMT 132, an output matching circuit 133 and a capacitor 134. The input matching circuit 131 consists of a transmission line 135, a stub 136 and a capacitor 137 connected in series. In this case, the point of connection between the transmission line 135 and the stub 136 is connected to the output terminal (the end of D.C. cut capacitor 117) of the voltage controlled oscillator 111. One end of the transmission line 135 (the terminal on the opposite side from the terminal connected to the stub 136) is connected to the gate of the HEMT 132. One end of the capacitor 137 (the terminal on the opposite side from the terminal connected to the stub 136) is grounded. Also, the point of connection between the stub 136 and the capacitor 137 is made as a voltage terminal 138 for supplying a gate bias to the HEMT 132.

The output matching circuit 133 is made up of a transmission line 139, a stub 140 and a capacitor 141 connected in series. In this case, the point of connection between the transmission line 139 and the stub 140 is connected to one end of the capacitor 134. One end of the transmission line 139 (the terminal on the opposite side from the terminal connected to the stub 140) is connected to the drain of the HEMT 132. One end of the capacitor 141 (the terminal on the opposites from the terminal connected to the stub 140) is grounded. Also, the point of connection between the stub 140 and the capacitor 141 is made as a voltage terminal 142 for supplying a drain bias to the HEMT 132.

The source of the HEMT 132 is grounded. This HEMT 132 is made with the same semiconductor film structure as the HEMT 114 of the negative resistance circuit 112. The gate length of the HEMT 132 is set to 0.5 $\mu$m, the unit gate width to 25 $\mu$m and the number of fingers to two. The other end of the capacitor 134 (the terminal on the opposite side from the terminal connected to the point of connection between the transmission line 139 and the stub 140) is made as the output terminal 143 of the amplifying circuit 130. An amplified oscillation output is taken out from this output terminal 143.

The input matching circuit 131 and the output matching circuit 133 are constructed to maximize the gain in the 30 GHz band, and so-called gain matching is effected. The transmission lines 135 and 139 and the stubs 136 and 140 of the amplifying circuit 130 are made by using the coplanar line 126, like the transmission lines and stubs of the voltage controlled oscillator 111 (i.e., the negative resistance circuit 112 and the resonating circuit 113).

The amplifying circuit 130 and the voltage controlled oscillator 111 are formed integrated on an InP substrate and thus constitute a single MMIC. The actual circuit pattern of this MMIC is shown in FIG. 14. The parts shown with reference numerals in this FIG. 14 are the same as the parts shown with the same reference numerals in FIG. 13 and will not be described in further detail for FIG. 14. In FIG. 14, the regions shown with hatching denote capacitors.

The control voltage (gate bias) vs. oscillation frequency characteristic of an MMIC (voltage controlled oscillator 111 and amplifying circuit 130) constructed as described above were measured. In this case, the drain bias of the HEMT 114 of the voltage controlled oscillator 111 (the voltage impressed on the voltage terminal 121) was set to 2.5 V. The gate bias of the HEMT 132 of the amplifying circuit 130 (the voltage impressed on the voltage terminal 138) was set to 0 V. The drain bias of the HEMT 132 (the voltage impressed on the voltage terminal 142) was set to 2.5 V. Then, the gate bias (D.C. bias voltage) impressed on the voltage terminal 125 was changed from 0.0 V to −0.40 V in small steps, and specifically in decrements of 0.01 V, while the oscillation frequency and the output power were measured.

The measurement results are shown plotted on a graph in FIG. 15. In this FIG. 15, the rhomboid points show the frequency characteristic and the circular points show the output power characteristic. This FIG. 15 clearly shows that in this fourth preferred embodiment also the oscillation frequency changes linearly with respect to change in the gate bias, i.e. the gate bias (D.C. bias voltage) and the oscillation frequency have extremely good linearity. Also, it can be seen that in this fourth preferred embodiment the output power is in the range of 1 dB to 2 dB, that is, a high output power was obtained.

Although in the fourth preferred embodiment described above the voltage controlled oscillator 111 and the amplifying circuit 130 were made as a single MMIC, the invention is not limited to this and for example a circuit such as a mixer or a frequency multiplier or a power amplifier may be made together with a voltage controlled oscillator 111 (or a voltage controlled oscillator 111 together with an amplifying circuit 130) as a single MMIC.

Figure 16:
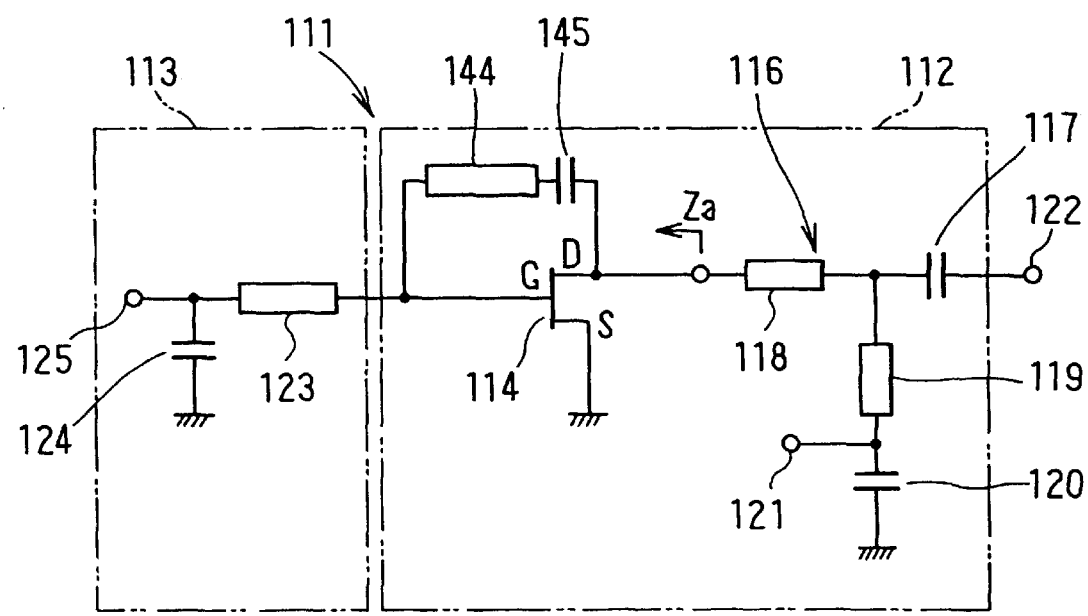
FIG. 16 is a circuit diagram showing a fifth preferred embodiment of the present invention.

FIG. 16 shows a fifth preferred embodiment of the present invention, and the features of this fifth preferred embodiment that are different from the third preferred embodiment will now be described. Parts the same as parts of the third preferred embodiment have been given the same reference numerals. In this fifth preferred embodiment, the transmission line 115 of the third preferred embodiment is not provided, i.e. the source of the HEMT 114 is directly grounded, and a transmission line 144 and a capacitor 145 are connected in series between the gate and the drain of the HEMT 114. As a result, parallel feedback is applied in the negative resistance circuit 112.

In the case of the construction described above, by changing the length of the transmission line 144 and changing the capacitance of the capacitor 145 it is possible to adjust the strength of the feedback of the feedback circuit so as to weaken it to below its maximum. That is, by adjustment of the length of the transmission line 144 and the capacitance of the capacitor 145 it is possible to provide linearity of the gate bias (D.C. bias voltage) and the oscillation frequency. However, compared to constructions wherein parallel feedback is applied as in this fifth preferred embodiment, adjustment of the feedback strength of the feedback circuit is simpler and design is easier with constructions wherein series feedback is applied, as in the third and fourth preferred embodiments.

Figure 17:
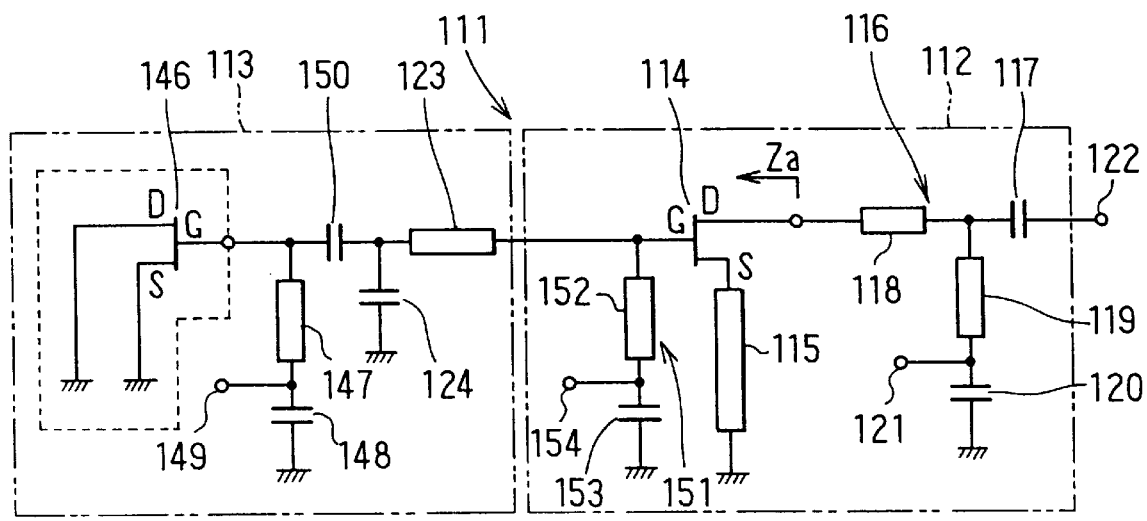
FIG. 17 is a circuit diagram showing a sixth preferred embodiment of the present invention.

FIG. 17 shows a sixth preferred embodiment of the present invention, and the features of this sixth preferred embodiment that are different from the third preferred embodiment will now be described. Parts the same as parts of the third preferred embodiment have been given the same reference numerals. In this sixth preferred embodiment, an HEMT 146 is provided in the resonating circuit 11.3 and the oscillation frequency is varied by changing the capacitance of the gate of this HEMT 146 by means of the bias voltage applied to this gate.

Specifically, the drain and the source of the HEMT 146 are grounded and the gate of the HEMT 146 is grounded through a circuit consisting of a transmission line 147 and a capacitor 148 connected in series. The point of connection between the transmission line 147 and the capacitor 148 is made as a voltage terminal 149 for applying a gate bias (control voltage or D.C. bias voltage). The gate of the HEMT 146 is connected to the point of connection between the transmission line 123 and the capacitor 124 through a capacitor 150.

A bias supply circuit 151 is connected to the gate of the HEMT 114 of the negative resistance circuit 112. This bias supply circuit 151 is made up of a transmission line 152 and a capacitor 153 connected in series. One end of the transmission line 152 (the terminal on the side opposite the terminal connected to the capacitor 153) is connected to the gate of the HEMT 114 and the transmission line 123 of the resonating circuit 113. One end of the capacitor 153 (the terminal on the opposite side from the terminal connected to the transmission line 152) is grounded. The point of connection between the transmission line 152 and the capacitor 153 constitutes a voltage terminal 154 for supplying a gate bias.

The rest of the construction of the sixth preferred embodiment described above is the same as that of the third preferred embodiment. Therefore, in this sixth preferred embodiment also, substantially the same effects as those of the third preferred embodiment can be obtained.

Figure 18:
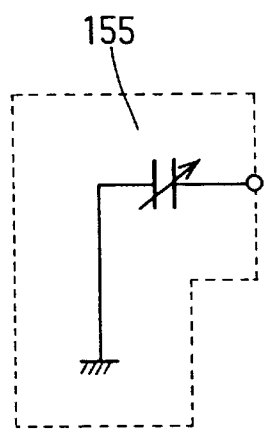
FIG. 18 is a partial circuit diagram illustrating a seventh preferred embodiment of the present invention.

In the resonating circuit 113 of this sixth preferred embodiment, instead of the HEMT 146, a variable capacitance diode (varactor) 155 of the construction shown in FIG. 18 may be used to constitute the voltage controlled oscillator according to a seventh preferred embodiment. In the case of this seventh preferred embodiment also, by changing the capacitance of the varactor 155 by means of the control voltage the oscillation frequency can be varied and it is possible to obtain the same effects as those of the sixth preferred embodiment.

Figure 19:
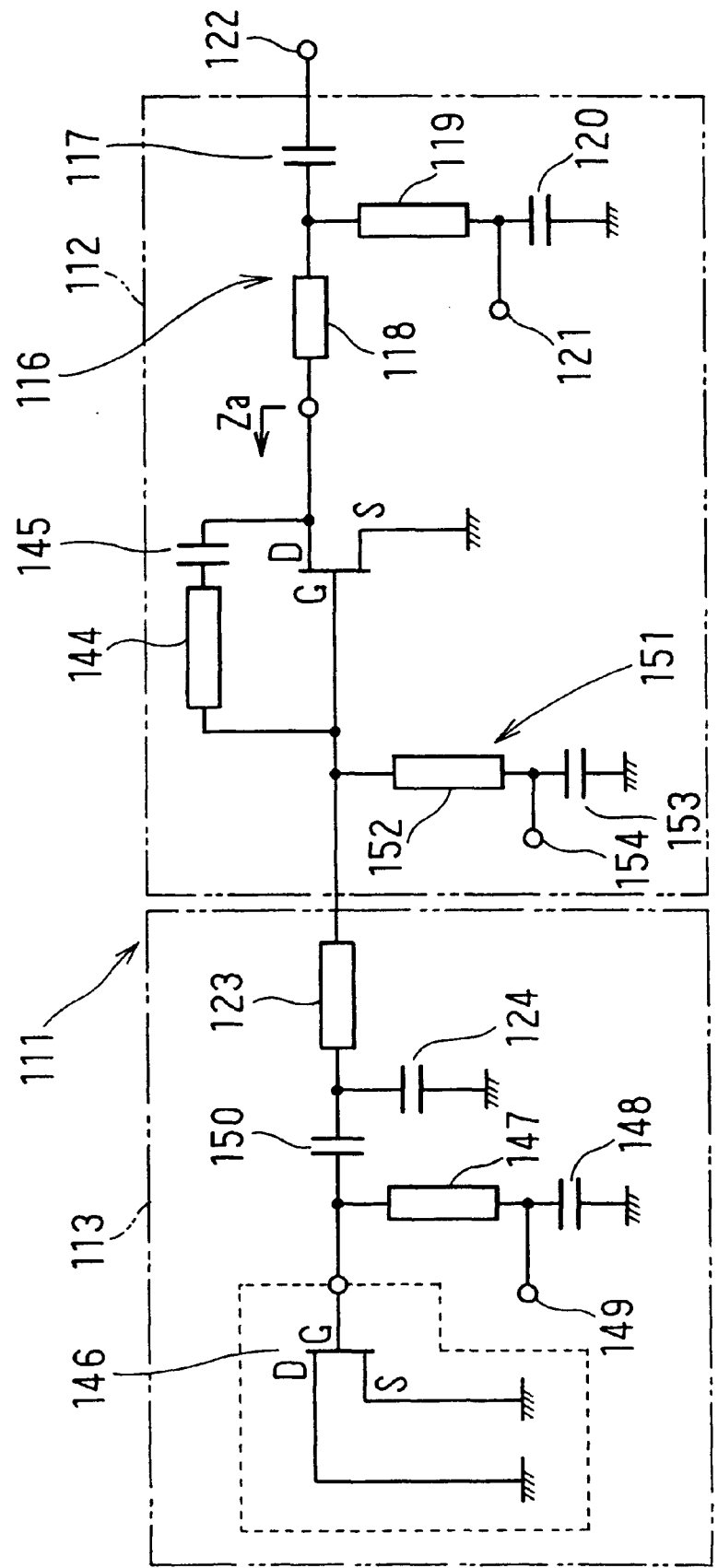
FIG. 19 is a circuit diagram showing an eighth preferred embodiment of the present invention.
Figure 20A:
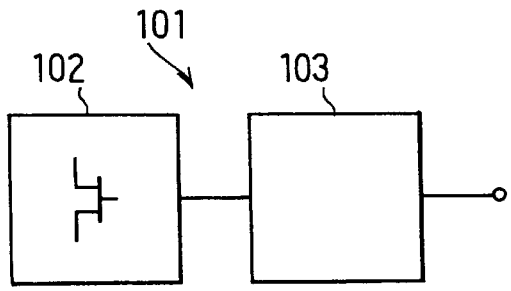
FIGS. 20A and 20B are block diagrams of oscillators showing a conventional oscillator construction.
Figure 20B:
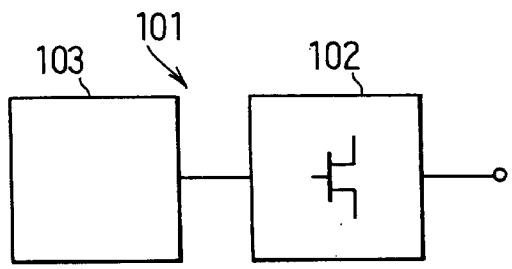
Figure 21:
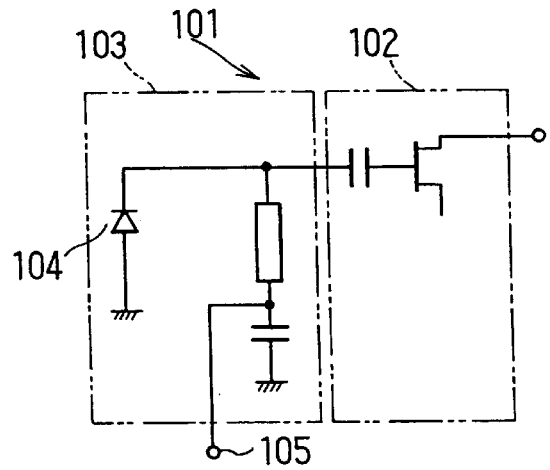
FIG. 21 is a circuit diagram showing a different conventional construction.
Figure 22:
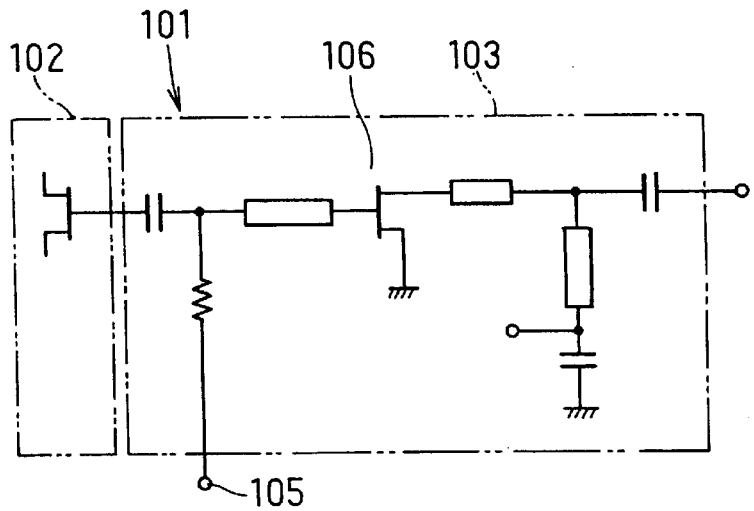
FIG. 22 is a circuit diagram showing another conventional oscillator construction.

FIG. 19 shows an eighth preferred embodiment of the present invention, and the features of this eighth preferred embodiment that are different from the sixth preferred embodiment will now be described. Parts the same as parts of the sixth preferred embodiment have been given the same reference numerals. In this eighth preferred embodiment, a negative resistance circuit of the fifth preferred embodiment, i.e. a parallel feedback negative resistance circuit, is used in a negative resistance circuit 112 according to the sixth preferred embodiment. Apart from this the construction of the eighth preferred embodiment is the same as that of the sixth preferred embodiment. Therefore, in this eighth preferred embodiment also, the same effects as those of the sixth preferred embodiment can be obtained.

In the resonating circuit 113 of the eighth preferred embodiment, instead of the HEMT 146, a variable capacitance diode (varactor) 155 of the construction shown in FIG. 18 may be used. In this case also, by changing the capacitance of the varactor 155 by means of the control voltage the oscillation frequency can be varied and it is possible to obtain the same effects as those of the eighth preferred embodiment.

In the fifth through eighth preferred embodiments described above an amplifying circuit for amplifying the oscillation output, for example the amplifying circuit 130 of the fourth preferred embodiment, may be integrally provided with the voltage controlled oscillator in a single MMIC. Also, in these fifth through eighth preferred embodiments, a circuit such as a mixer or a frequency multiplier or a power amplifier may be made together with a voltage controlled oscillator 111 (or a voltage controlled oscillator 111 together with an amplifying circuit 130) as a single MMIC.

What is claimed is:

1. A frequency multiplier for inputting an input signal to a transistor through an input matching circuit and outputting a multiplied output signal from said transistor through a reflecting type fundamental wave signal band suppressing circuit and an output matching circuit, said frequency multiplier comprising:
   a transmission line disposed between an output terminal of said transistor and an input terminal of said reflecting type fundamental wave signal band suppressing circuit, for producing a standing wave therebetween, wherein:
   a length of said transmission line is set so that a fundamental wave signal output from said transistor and a reflection signal are in a phase relationship such that said fundamental wave signal and said reflection signal superimpose each other and are strengthened, the reflection signal resulting from said fundamental wave signal being reflected by said reflecting type fundamental wave signal band suppressing circuit and reflected again at said output terminal of said transistor, and
   said length of said transmission line is set so that a phase difference $\phi d$ between said fundamental wave signal and said reflection signal lies within a range defined by $$n \times 360 - 120 \leq \phi d \leq n \times 360 + 120$$

wherein n (n≥0) is an integer.

2. A frequency multiplier according to claim 1, wherein said transistor is a high electron mobility transistor.

3. A frequency multiplier according to claim 1, wherein said frequency multiplier is used for a millimeter wave radar system.

4. A frequency multiplier according to claim 1, wherein said transmission line is a coplanar line.

5. A frequency multiplier according to claim 1, wherein said length of the transmission line is set so that the phase of said fundamental wave signal and the phase of said reflection signal become the same phase.

6. A frequency multiplier according to claim 1, wherein when a phase characteristic of a reflection coefficient ΓA of an output terminal side of said transistor as seen from said transmission line is $\phi A$ and a phase characteristic of a reflection coefficient ΓB of an input terminal side of said reflecting type fundamental wave signal band suppressing circuit as seen from said transmission line is $\phi B$ and a phase lag of said fundamental wave signal corresponding to a length Ld of said transmission line is $\phi L$, said phase difference $\phi d$ is defined by $$\phi d = (2 \times \phi L) + \phi A + \phi B,$$

where said phase lag $\phi L$ (degrees) is defined by $$\phi L = (Ld/\lambda) \times 360,$$

where $\lambda$ is a wavelength of said fundamental wave signal inside said transmission line, and said reflection coefficients $\Gamma A$, $\Gamma B$ have respective amplitude characteristics $\alpha$, $\beta$ besides said corresponding phase characteristics $\phi A$, $\phi B$, whereby said reflection coefficient $\Gamma A$ is $\alpha \angle \phi A$ and said reflection coefficient $\Gamma B$ is $\alpha \angle \phi \beta$.

7. A frequency multiplier according to claim 1 wherein when a high-frequency signal of an even order is outputted as said multiplied output signal, said reflecting type fundamental wave signal band suppressing circuit is one of an open stub having a length equal to ¼ of a given wavelength inside said transmission line corresponding to a frequency of said fundamental wave signal to be suppressed and a short stub having a length equal to ½ of said given wavelength.

* * * * *